(12) United States Patent
Oku et al.

(10) Patent No.: US 8,212,338 B2
(45) Date of Patent: Jul. 3, 2012

(54) MANUFACTURING METHOD OF SEMICONDUCTOR DEVICE AND SEMICONDUCTOR DEVICE PRODUCED THEREWITH

(75) Inventors: Yoshiaki Oku, Kyoto (JP); Nobutoshi Fujii, Chigasaki (JP); Kazuo Kohmura, Minato-ku (JP)

(73) Assignee: ULVAC, Kanagawa (JP)

( * ) Notice: Subject to any disclaimer, the term of this patent is extended or adjusted under 35 U.S.C. 154(b) by 0 days.

(21) Appl. No.: 12/760,041

(22) Filed: Apr. 14, 2010

(65) Prior Publication Data

US 2010/0200990 A1 Aug. 12, 2010

Related U.S. Application Data

(62) Division of application No. 11/661,706, filed as application No. PCT/JP2005/016031 on Sep. 1, 2005, now Pat. No. 7,727,907.

(30) Foreign Application Priority Data

Sep. 2, 2004 (JP) ................................. 2004-255463

(51) Int. Cl.
*H01L 21/00* (2006.01)
(52) U.S. Cl. .......... 257/635; 257/E21.561; 257/E21.567
(58) Field of Classification Search ............ 257/E21.576
See application file for complete search history.

(56) References Cited

U.S. PATENT DOCUMENTS

| 6,077,792 A | 6/2000 | Farrar |
| 6,121,130 A | 9/2000 | Chua |
| 6,475,929 B1 | 11/2002 | Gabriel et al. |
| 6,531,755 B1 | 3/2003 | Usami |
| 6,533,855 B1 | 3/2003 | Gaynor et al. |
| 6,566,243 B2 | 5/2003 | Gaynor |
| 6,709,806 B2 | 3/2004 | Hotta et al. |
| 6,720,211 B2 | 4/2004 | Izumi et al. |
| 7,176,144 B1 | 2/2007 | Wang et al. |
| 7,727,907 B2 * | 6/2010 | Oku et al. ..................... 438/783 |
| 2003/0001282 A1 | 1/2003 | Meynen et al. ............... 257/777 |
| 2003/0006507 A1 | 1/2003 | Oku |

(Continued)

FOREIGN PATENT DOCUMENTS

JP 2000-294634 10/2000

(Continued)

OTHER PUBLICATIONS

Oku et al., "Novel Self-Assembled Ultra-Low-k Porous Silica Films with High Mechanical Strength for 45 nm BEOL Technology", IEEE International Electron Devices Meeting, 2003, Technical Digest, Dec. 8, 2003, pp. 6.1.1-6.1.4.

*Primary Examiner* — Michael Lebentritt
(74) *Attorney, Agent, or Firm* — Hamre, Schumann, Mueller & Larson, P.C.

(57) ABSTRACT

A semiconductor device (having an interlayer insulating film) which is sufficiently low in the dielectric constant and high in the mechanical strength is provided.

A manufacturing method of a semiconductor device includes: a step of forming a dielectric thin film in which a plurality of pores are arranged around a skeleton mainly made of a Si—O bond, on a surface of a semiconductor substrate on which a desired element region is formed; a step of applying patterning on a surface of the dielectric thin film through a mask; and a step of bringing a gas containing at least one kind of tetramethylcyclotetrasiloxane (TMCTS), hexamethyldisilazane (HMDS) and trimethylchlorosilane (TMCS) molecules into contact with the patterned surface of the dielectric thin film.

4 Claims, 29 Drawing Sheets

U.S. PATENT DOCUMENTS

| | | |
|---|---|---|
| 2005/0079705 A1 | 4/2005 | Takeuchi |
| 2005/0242414 A1 | 11/2005 | Angyal et al. |
| 2006/0040110 A1 | 2/2006 | Kohmura et al. |
| 2008/0122101 A1 | 5/2008 | Oku et al. |

FOREIGN PATENT DOCUMENTS

| | | |
|---|---|---|
| JP | 2001-118842 | 4/2001 |
| JP | 2002-343796 | 11/2002 |
| JP | 2003-17482 | 1/2003 |
| JP | 2003-282698 | 10/2003 |
| JP | 2004-511896 | 4/2004 |
| JP | 2004-210579 | 7/2004 |
| TW | 488026 | 5/2002 |
| TW | 490738 | 6/2002 |
| TW | 498489 | 8/2002 |
| TW | 498504 | 8/2002 |
| TW | 200416951 A | 9/2004 |
| WO | 02/01621 | 1/2002 |
| WO | 03/028097 | 4/2003 |
| WO | 03/077032 | 9/2003 |
| WO | 2004/026765 | 4/2004 |

\* cited by examiner

FIG. 8

KINDS OF PROCESSES: THREE KINDS OF ASHING (A1, A2, A3), ORGANIC CLEANING (WC), HALF ETCHING (HE), TMCTS RECOVERY (T)

| Abbr. | Process |
|---|---|
| Ref | As prepared (without processing) |
| A1 | $CF_4/O_2$ ashing followed by $O_2$ ashing |
| A1+T | TMCTS treatment after $CF_4/O_2$ ashing followed by $O_2$ ashing |
| A2 | $CF_4/O_2$ ashing |
| A2+T | TMCTS treatment after $CF_4/O_2$ ashing |
| A3 | $O_2$ ashing |
| A3+T | TMCTS treatment after $O_2$ ashing |
| WC | Wet cleaning (organic acid) |
| WC+T | TMCTS treatment after wet cleaning (organic acid) |
| HE | Half etching ($Ar/C_5F_8/O_2$) |
| HE+T | TMCTS treatment after half etching ($Ar/C_5F_8/O_2$) |

FIG. 9

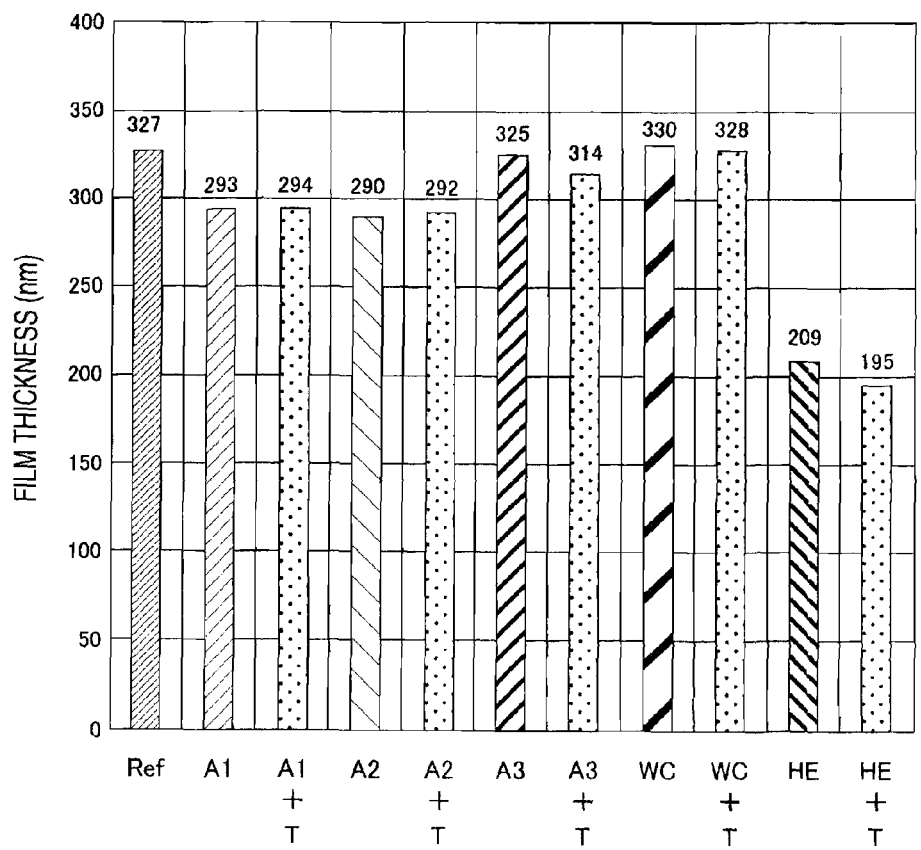

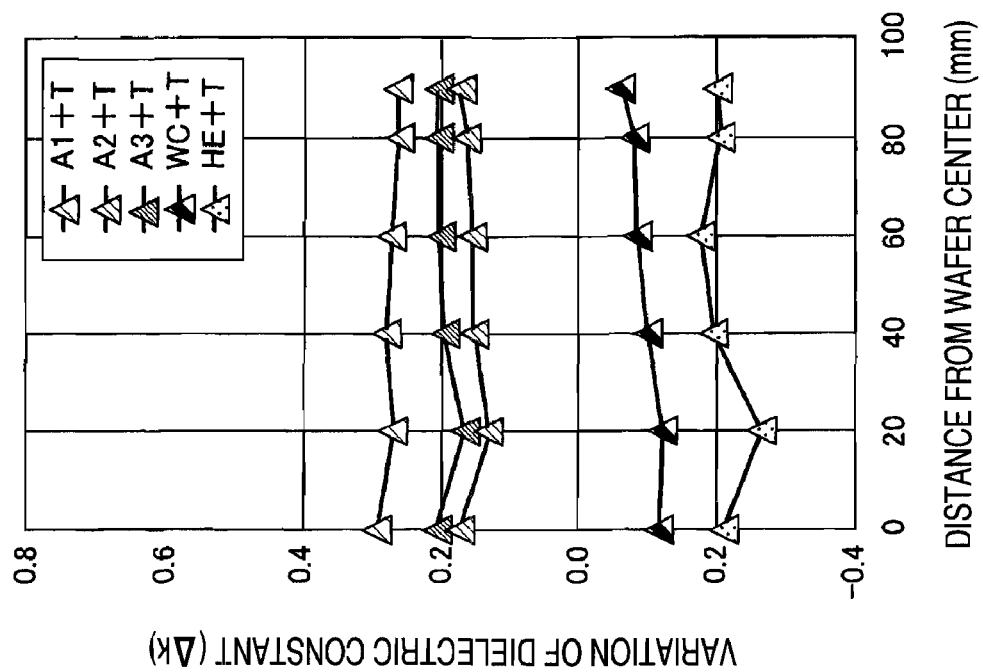
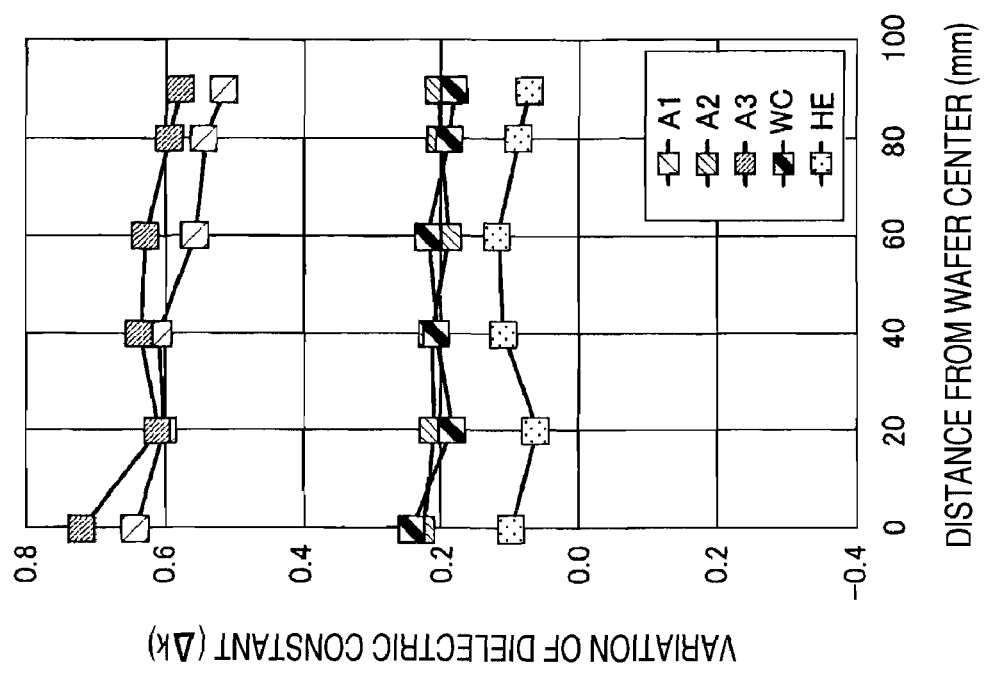
FIG. 13 (a)
FIG. 13 (b)

FIG. 15 (a)
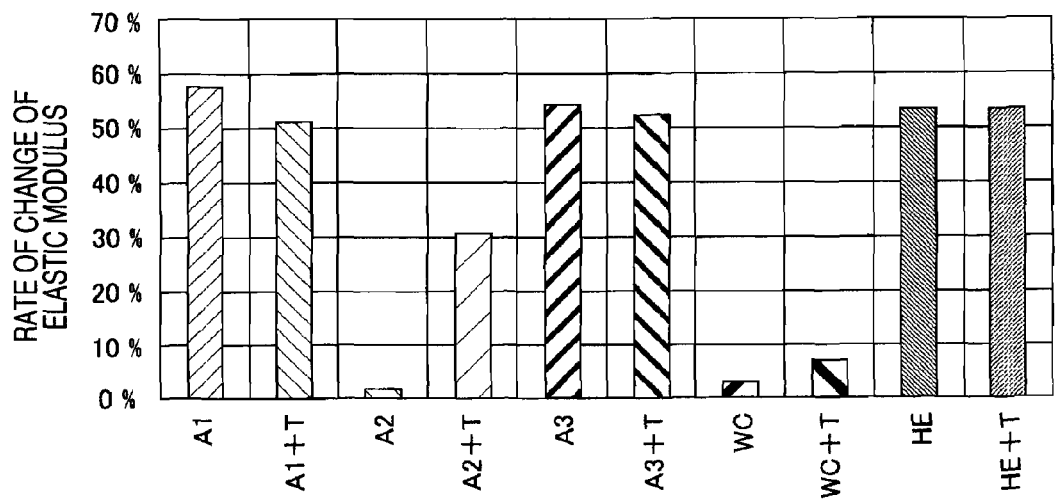
FIG. 15 (b)
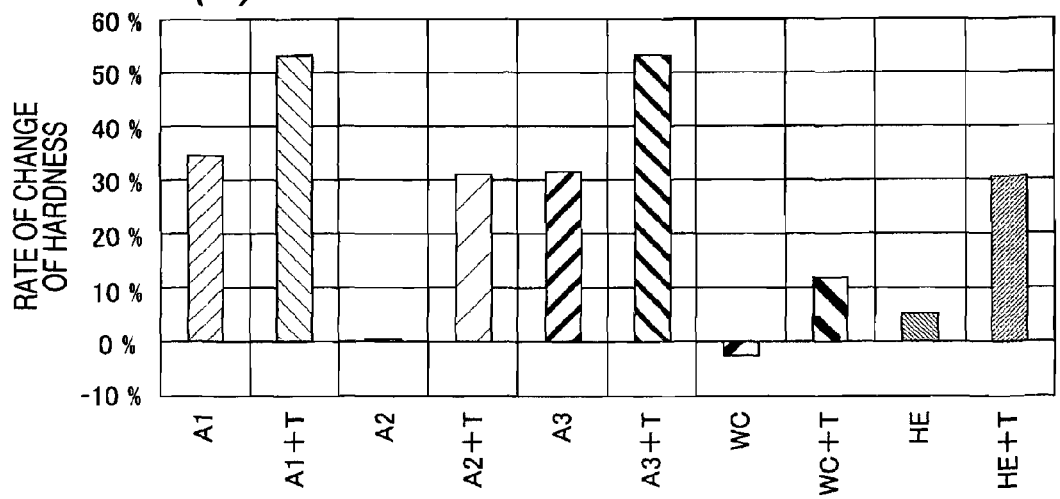
FIG. 15 (c)
| | Ref | A1 | A2 | A3 | WC | HE |
|---|---|---|---|---|---|---|
| E(GPa) | 4.141 | 6.533 | 4.221 | 6.400 | 4.260 | 6.362 |
| H(GPa) | 0.496 | 0.668 | 0.498 | 0.653 | 0.483 | 0.523 |
| ΔE/E(%) | 0% | 58% | 2% | 55% | 3% | 54% |
| ΔH/H(%) | 0% | 35% | 0% | 32% | -3% | 5% |
| | Ref | A1+T | A2+T | A3+T | WC+T | HE+T |
| E(GPa) | 4.141 | 6.270 | 5.416 | 6.319 | 4.430 | 6.077 |
| H(GPa) | 0.496 | 0.760 | 0.651 | 0.761 | 0.555 | 0.648 |
| ΔE/E(%) | 0% | -4% | 28% | -1% | 4% | -4% |
| ΔH/H(%) | 0% | 14% | 31% | 17% | 15% | 24% |

FIG. 23
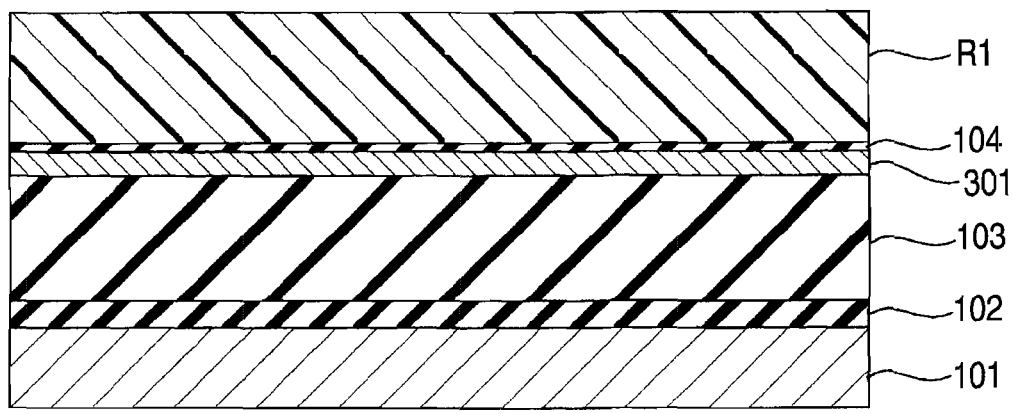
(e)
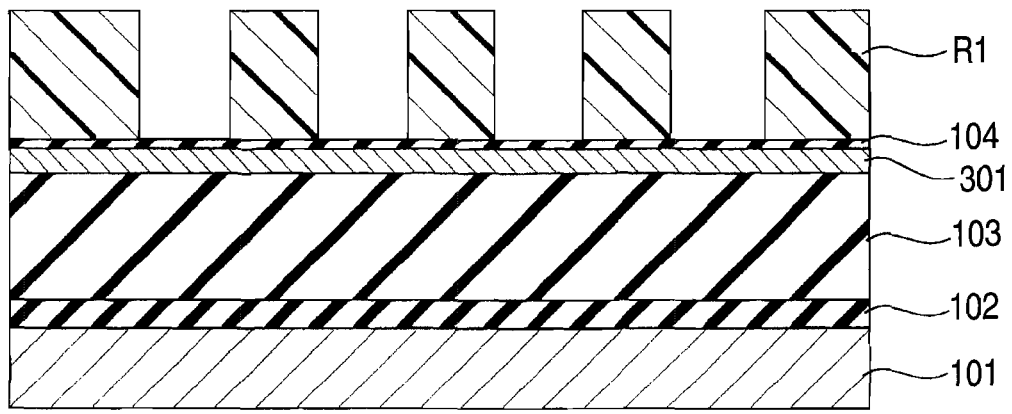
(f)

MANUFACTURING METHOD OF SEMICONDUCTOR DEVICE AND SEMICONDUCTOR DEVICE PRODUCED THEREWITH

CROSS-REFERENCE TO RELATED APPLICATIONS

This application is a Division of application Ser. No. 11/661,706, filed Mar. 1, 2007, which is a U.S. National Stage of PCT/JP2005/016031 filed Sep. 1, 2005, which applications are incorporated herein by reference.

TECHNICAL FIELD

The invention relates to a manufacturing method of a semiconductor device and a semiconductor device produced therewith, in particular, to a recovery technology of process damage in a dielectric thin film.

RELATED ART

In order to realize high speed/low power consumption of a semiconductor device, it is very important to lower the dielectric constant of an interlayer insulating film. In order to lower the dielectric constant, there have been proposed various devises. The inventors proposed a dielectric thin film in which pores are regularly arranged (patent literature 1).

Furthermore, as a modification method of a dielectric thin film, a method where an organic silicon compound is brought into contact with a dielectric thin film made of a Si—O bond to thermally treat without using a metal catalyst to improve the hydrophobicity and the mechanical strength is proposed as well (patent literature 2).

Although a dielectric thin film like this is high in the pore rate and can lower the dielectric constant, when it is actually used in a semiconductor device, various processes have to be undergone. Accordingly, even when a dielectric thin film high in the pore rate and low in the dielectric constant can be formed, because of high pore rate, in subsequent various processes including a patterning process, in many cases, etching residue sticks to the inside of the pores, resulting in causing a rise in the dielectric constant or a deterioration in the mechanical strength.

For instance, as an example of a technology by which a wiring structure is formed on a surface of a semiconductor substrate, there is a technology called a damascene process.

An example of the damascene process will be described.

In the beginning, as shown in FIG. 27(a), on a surface of a silicon substrate 101 on which an element region is formed, as shown in FIG. 27(b), as an etching stopper 102, a silicon nitride (SiN) film having a film thickness of substantially 50 nm is formed, and thereon, as shown in FIG. 27(c), as a low dielectric thin film 103, a porous silica film is formed.

When a layer is formed, firstly, in a precursor solution obtained by dissolving a cationic cetyltrimethyl ammonium bromide (CTAB: $C_{16}H_{33}N^+(CH_3)_3Br^-$) as a surface active agent, tetraethoxy silane (TEOS) as a silica derivative and hydrochloric acid (HCl) as an acid catalyst in a mixed solvent $H_2O$/alcohol, a substrate on which a first wiring layer (not shown in the drawing) is formed is immersed and held at a temperature in the range of 30 to 150° C. for 1 to 120 hr to polymerize the silica derivative due to a hydrolysis and polycondensation reaction (preliminary crosslinking step) to form a periodic self-agglomerate of the surface active agent. The substrate is pulled up, followed by washing with water and drying, further followed by heating and calcining at 400° C. for 3 hr in air or a nitrogen atmosphere to completely pyrolyze and remove the surface active agent of a mold to form a pure mesoporous silica thin film.

Thus obtained dielectric thin film 103 is patterned to form a contact pore. As shown in FIG. 28(d), as a anti-reflective layer 104, an organic resin film is formed, followed by coating photoresist R1.

In the next place, as shown in FIG. 28(e), by photolithography, a pattern is exposed, followed by developing to form a resist pattern R1.

Subsequently, as shown in FIG. 29(f), with the resist pattern R1 as a mask, the dielectric thin film 103 is etched to form a wiring groove.

Further thereafter, as shown in FIG. 29(g), the resist pattern R1 and anti-reflective film 104 are asked to remove.

Subsequently, as shown in FIG. 30(h), a CF deposit film on a sidewall of the wiring groove due to the etching is removed, followed by washing with an organic solvent to remove damage, and thereby a surface is cleansed.

Then, on a cleansed surface, by means of a PVD (Physical Vapor Deposition) method, CVD (Chemical Vapor Deposition) method or ALD (Atomic Layer Deposition) method, as a diffusion inhibition barrier film 105, a tantalum nitride (TaN) film, TaN/Ta laminate film, Ta film or WN film is formed, followed by forming a copper thin film as a seed film 106 for copper plating (FIG. 30(i)).

Thereafter, as shown in FIG. 31(j), on the copper seed film 106, by means of the electroplating method, a copper plating layer as a wiring layer 107 is formed.

Finally, as shown in FIG. 31(k), a surface is flattened by use of the CMP to polish and remove an excess copper plating layer and seed film 106, followed by forming a wiring layer in the wiring groove, finally, as shown in FIG. 31(l), a SiN film 108 is formed as a cap film.

When a barrier layer is formed before the seed film 106 is formed, the barrier layer 105 of a region from where the copper plating layer 107 and the seed film (106) are polished and removed is removed as well.

Thus, a wiring structure having a flat surface can be obtained.

However, in actuality, the dielectric constant such as designed cannot be obtained, resulting in, in some cases, causing a leakage current or deteriorating the mechanical strength to make sufficient flattening due to the CMP incapable.

From various experimental results, the inventors found the followings.

That is, even when such a mesoporous thin film is formed, immediately after the film-forming, with effective characteristics as a dielectric thin film having sufficiently high mechanical strength and low dielectric constant, in an actual production of a semiconductor device, various processes such as an etching process and a resist peeling process for patterning are necessary. Both in the etching process of the dielectric thin film and in the removing process of the resist, the dielectric thin film is exposed to a reactive atmosphere including an etching gas.

It is considered that, as a result, since the pore rate of the porous thin film that is formed with labor and high in the pore rate is deteriorated and moisture tends to stick to a surface thereof, sufficient characteristics as an interlayer insulating film of a semiconductor device cannot be obtained.

Thus, damages are caused in the etching process of the dielectric thin film 103 (FIG. 29(f)) and the peeling process (asking process in FIG. 29(g)) to deteriorate the dielectric thin film. Accordingly, the dielectric thin film is deteriorated and thereby the intrinsic characteristics thereof cannot be exerted.

Furthermore, the dielectric thin film is likely to be subjected to damages in various processes after the film-forming such as damages in organic washing for removing the etching residue (FIG. 30(h)) and after the CMP process (FIG. 31(k)). Accordingly, there are problems in deterioration of the mechanical strength, peeling and resultant generation of leakage current.

While such a mesoporous thin film is high in the pore rate and low in the dielectric constant, water and the like tend to intrude inside of the pores and contamination from a gaseous phase tends to occur. Accordingly, when it is used in an actual production of a semiconductor device as an interlayer insulating film, as designed values of the dielectric constant and mechanical strength can be obtained only with difficulty.

Patent literature 1: JP-A-2003-17482
Patent literature 2: JP-A-2004-210579

DISCLOSURE OF THE INVENTION

Problems that the Invention is to Solve

As mentioned above, in an existing semiconductor manufacturing process, there are problems in that neither the dielectric constant of an interlayer insulating film can be sufficiently lowered nor the mechanical strength is sufficient.

Furthermore, as a semiconductor device is miniaturized, without restricting to the damascene structure such as mentioned above, a surface is more and more flattened; accordingly, in many cases, the CMP resistance of a insulating film of the interlayer insulating film or the like is a necessary condition. In order to sufficiently exert the CMP resistance, desired elastic modulus and hardness are necessary to be combined.

The invention has been made in view of the above-mentioned situations and intends to provide a semiconductor device (provided with an interlayer insulating film) sufficiently low in the dielectric constant and high in the mechanical strength.

Means for Solving the Problems

In this connection, a manufacturing method of a semiconductor device of the invention, comprising:

a step of forming a dielectric thin film in which a plurality of pores are arranged around a skeleton mainly made of a Si—O bond, on a surface of a semiconductor substrate on which a desired element region is formed;

a step of applying patterning on a surface of the dielectric thin film through a mask; and a step of bringing a gas containing at least one kind of tetramethylcyclotetrasiloxane (TMCTS), hexamethyldisilazane (HMDS) and trimethylchlorosilane (TMCS) molecules into contact with the patterned surface of the dielectric thin film.

According to such a method, an insulating film can be formed by a dielectric thin film in which a plurality of pores are arranged around a skeleton mainly made of a Si—O bond. Accordingly, since the dielectric constant of air is low, the dielectric constant can be largely lowered and, to process damages generated owing to the pores, when a gas containing at least one kind of TMCTS, HMDS and TMCS molecules is brought into contact, even when the process damages are inflicted, excellent recovery can be obtained. As a result, the extremely low dielectric constant of an insulating film immediately after film-forming can be maintained and thereby an insulating film high in the mechanical strength and high in the reliability can be obtained.

Furthermore, since damages inflicted in the resist asking process as well can be recovered, not with a hard mask but with a resist mask a patterning step can be carried out, resulting in realizing low cost and an improvement in the patterning accuracy.

When damages are inflicted, such changes as Si—CH$_3$ bond→Si—OH bond, Si—H bond→Si—OH bond and Si—O—Si bond→2Si—OH bonds are caused, or, after once forming a radical, a Si—OH bond is generated, or, owing to a wiring forming process, a site where H$_2$O is adsorbed is newly formed.

Thereby, the electric characteristics, the stability with time and the like are considered deteriorated.

In this connection, since a process for recovery, that is, a recovery process can be readily realized by substituting a gas in a chamber that is used in the recovery process, the workability as well is excellent. That is, a Si—OH bond formed owing to the damages changes, due to the recovery process, to a Si—CH$_3$ bond, Si—O—Si bond or Si—H bond. Furthermore, when a Si—CH$_3$ bond or Si—O—Si bond is newly imparted through a Si—H bond or Si—OH bond, the electric characteristics and the stability with time can be improved.

Now, as applicable dielectric thin films, a porous silica film, zeolite film, HSQ film, MSQ film and the like can be cited. As forming methods, without restricting to a coating and calcining method, gas phase deposition methods such as a CVD method and the like can be used. For instance, SiOC, SiOCH, SiCN and SiCO films are films obtained by rendering hydrophobic with silica derivatives such as TMCTS, HMDS, TMCS and the like as needs arise.

Silica derivatives that are used in the recovery process may be used singularly or continuously, simultaneously or alternatively in a combination of a plurality of kinds of silica derivatives.

Furthermore, when the TMCTS is used in the recovery process, not only the hydrophobicity and electric characteristics but also the mechanical strength and the interfacial adhesiveness can be improved.

Still furthermore, the recovery process is desirable to be a high concentration, in particular, super critical TMCTS recovery treatment. This is same as well in a case of silica derivatives such as HMDS, TMCS or the like.

Furthermore, the TMCTS recovery treatment can be applied as well to protection in the wiring forming process.

In addition, the recovery treatment may be, other than the thermal annealing, a plasma CVD treatment. Furthermore, when light irradiation is added, the reactivity can be more improved and the recovery effect can be heightened.

Furthermore, since the formation under low temperatures can be applied, even when it is used as an interlayer insulating film of an integrated circuit, without adversely affecting on an undercoat, an insulating film high in the reliability can be formed. Since it can be formed without applying a heating process of 500° C. or more, it can be applied even when an aluminum wiring is used.

Still furthermore, since the dielectric thin film can be formed when a precursor solution is fed followed by calcining, precise pattern formation can be applied even to a miniature region. Accordingly, the reliability of the dielectric thin film can be improved.

Furthermore, when the concentration of the precursor solution is controlled, the pore rate can be appropriately controlled. Accordingly, insulator thin films having desired dielectric constant can be formed with very good workability.

Accordingly, an insulating film having low capacitance can be readily formed, the parasite capacitance can be reduced and a high-speed semiconductor device can be obtained.

Now, a molecular formula of TMCTS (1,3,5,7-tetramethylcyclotetrasiloxane ((SiH(CH$_3$))$_4$O$_4$) is as shown below.

[Chemical formula 1]

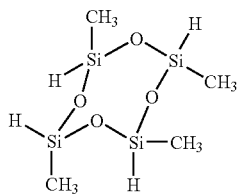

Furthermore, a molecular formula of (hexamethyldisilazane ((CH$_3$)$_3$SiNHSi(CH$_3$)$_3$) is as shown below.

[Chemical formula 2]

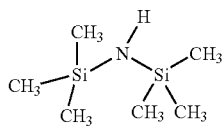

Still furthermore, a molecular formula of TMCS (trimethylchlorosilane ((CH$_3$)$_3$SiCl)) is as shown below.

[Chemical formula 3]

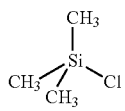

Furthermore, In the manufacturing method of a semiconductor device of the invention,
the patterning step includes:
a step of forming a resist mask on the surface of the dielectric thin film obtained in the film-forming step; and
a step of etching the dielectric thin film through the resist mask.

According to the method, while including steps of generating damages such as an ashing step and the like, a recovery treatment is carried out. Accordingly, the patterning step can be applied, without forming a hard mask, by use of the resist mask. As the result, a pattern can be formed with high transfer precision and less number of steps is necessary for manufacture.

Furthermore, in the manufacturing method of a semiconductor device of the invention,
the patterning step includes:
a step of forming a hard mask on the surface of the dielectric thin film obtained in the film-forming step;
a step of etching the dielectric thin film through the hard mask; and
before the step of etching the dielectric thin film, a step of peeling and removing a resist for the patterning of the hard mask.

According to the method, although the number of steps is increased, since the dielectric thin film can be inhibited from directly coming into contact with the resist, the dielectric thin film can be inhibited from deteriorating owing to the ashing.

Furthermore, the manufacturing method of a semiconductor device of the invention, further comprising:
after the step of peeling and removing and before the step of etching the dielectric thin film, a step of bringing a gas containing at least one kind of tetramethylcyclotetrasiloxane (TMCTS), hexamethyldisilazane (HMDS) and trimethylchlorosilane (TMCS) molecules into contact.

Still furthermore, the manufacturing method of a semiconductor device of the invention, further comprising:
after the step of etching, a step of bringing a gas containing at least one kind of tetramethylcyclotetrasiloxane (TMCTS), hexamethyldisilazane (HMDS) and trimethylchlorosilane (TMCS) molecules into contact with the surface of the dielectric thin film.

The hard mask may be used as it is as an insulating film of a device or may be removed. When the hard mask is removed, even after the removal thereof, when the gas is brought into contact with a surface of the dielectric thin film therefrom the hard mask is removed, the recovery property can be more improved.

Furthermore, In the manufacturing method of a semiconductor device of the invention,
the hard mask is a two-layer film, and
the manufacturing method comprising:
a step of asking the resist in a state that the hard mask on a lower layer side is remained; and
a step of etching the hard mask on the lower layer side by using the hard mask on an upper layer side as a mask.

According to the method, the number of steps increases. However, the resist can be assuredly inhibited from coming into contact directly with the dielectric thin film and thereby the dielectric thin film can be inhibited from deteriorating owing to the asking. Furthermore, when the hard mask is made of a dielectric thin film, the hard mask, without removing, can be used as it is as an insulating film.

Furthermore, In the manufacturing method of a semiconductor device of the invention, the patterning step is a step of forming a groove for forming a wiring, and
the patterning step includes:
a step of forming a conductive material layer in the groove; and
before the step of forming the conductive material layer,
a step of cleaning the surface of the dielectric thin film on which the groove for forming the wiring is formed, and
a step of bringing a gas containing at least one kind of tetramethylcyclotetrasiloxane (TMCTS), hexamethyldisilazane (HMDS) and trimethylchlorosilane (TMCS) molecules into contact with the cleansed surface of the dielectric thin film.

The step of cleaning intends to remove etching residue such as CF$_4$ and the like. Other than organic cleaning, a dry process with plasma as well can be applied to cleanse.

Furthermore, In the manufacturing method of a semiconductor device of the invention,
the step of forming the conductive material layer includes:
a step of forming a seed layer for plating in the groove for forming the wiring;
a step of forming a plating layer by applying electroplating on the seed layer; and
a step of removing the plating layer and the seed layer on the dielectric thin film by a CMP step.

According to the method, a damascene structure high in the reliability can be formed. Before the seed layer is formed, a diffusion barrier layer may be formed. The method is more effective in a case where a copper plating layer is used.

Furthermore, the manufacturing method of a semiconductor device of the invention, further comprising:
after the removing step, a step of bringing a gas containing at least one kind of tetramethylcyclotetrasiloxane (TMCTS), hexamethyldisilazane (HMDS) and trimethylchlorosilane (TMCS) molecules into contact with the surface of the dielectric thin film.

Furthermore, in the manufacturing method of a semiconductor device of the invention, the patterning step is a step of forming a throughhole for forming a contact, and the patterning step includes:

a step of forming a conductive material layer in the throughhole; and before the step of forming the conductive material layer, a step of applying organic cleaning on the surface of the dielectric thin film on which the throughhole is formed, and a step of bringing a gas containing at least one kind of tetramethylcyclotetrasiloxane (TMCTS), hexamethyldisilazane (HMDS) and trimethylchlorosilane (TMCS) molecules into contact with the surface of the dielectric thin film to which the organic cleaning is applied.

The manufacturing method of a semiconductor device of the invention, further comprising:

before forming the mask, a step of bringing a gas containing at least one kind of tetramethylcyclotetrasiloxane (TMCTS), hexamethyldisilazane (HMDS) and trimethylchlorosilane (TMCS) molecules into contact with the surface of the formed dielectric thin film.

Furthermore, in the manufacturing method of a semiconductor device of the invention, the step of forming the dielectric thin film includes:

a step of generating a precursor solution that contains a silica derivative and a surface active agent, and has a composition ratio such that desired said pores are arranged;

a preliminary crosslinking step of increasing a temperature of the precursor solution to start a crosslinking reaction;

a step of feeding the precursor solution in which the crosslinking reaction is started in the preliminary crosslinking step on the surface of the semiconductor substrate; and a step of calcining the semiconductor substrate that is brought into contact with the precursor solution, and decomposing and removing the surface active agent.

Still furthermore, the manufacturing method of a semiconductor device of the invention, further comprising:

a step of generating a precursor solution that contains a silica derivative and a surface active agent, and has a composition ratio such that desired said pores are arranged;

a step of feeding the precursor solution on the surface of the semiconductor substrate;

a preliminary crosslinking step of heating the semiconductor substrate that is brought into contact with the precursor solution, to start a crosslinking reaction; and a step of calcining the semiconductor substrate, and decomposing and removing the surface active agent.

Furthermore, in the manufacturing method of a semiconductor device of the invention, the feeding step is a step of immersing the semiconductor substrate in the precursor solution.

Still furthermore, in the manufacturing method of a semiconductor device of the invention, the feeding step includes:

a step of immersing the semiconductor substrate in the precursor solution and pulling the semiconductor substrate up at a desired speed.

Furthermore, in the manufacturing method of a semiconductor device of the invention, the feeding step is a step of coating the precursor solution on the semiconductor substrate.

Still furthermore, in the manufacturing method of a semiconductor device of the invention, the feeing step is a rotary coating step of dropping the precursor solution on the semiconductor substrate and rotating the substrate.

Furthermore, in the manufacturing method of a semiconductor device of the invention, the precursor solution allows the pores to be periodically arranged. Alternatively, pores may be non-periodically arranged.

Still furthermore, a semiconductor device of the invention, comprising:

a dielectric thin film having contact pores formed by using the above method; and a conductive film filled in the contact pores.

In the semiconductor device of the invention, the conductive film filled in the contact pores of the dielectric thin film formed on a surface of a semiconductor substrate is formed so as to come into contact with the semiconductor substrate.

Furthermore, in the semiconductor device of the invention, the dielectric thin film is a porous silica thin film, and a copper thin film formed inside the contact pores constitutes a wiring layer.

Still furthermore, in the semiconductor device of the invention, the porous silica thin film has a thickness of 0.05 to 2 µm.

In the semiconductor device of the invention, the porous silica thin film has fine pores having a cubic structure, and at least a part of the fine pores is closed.

Furthermore, in the semiconductor device of the invention, the fine pores are formed so as to have a wall distance of 0.2 to 2.5 nm.

Advantage of the Invention

According to the method of the invention, owing to the recovery treatment, a high quality insulating film can be provided.

BRIEF DESCRIPTION OF THE DRAWINGS

FIG. 8 is a diagram showing process kinds used in the embodiment of the invention, FIG. 9 is an explanatory diagram of an advantage due to the recovery treatment used in the embodiment 1 of the invention, FIG. 13 is an explanatory diagram of an advantage due to the recovery treatment used in the embodiment 1 of the invention, FIG. 15 is an explanatory diagram of an advantage due to the recovery treatment used in the embodiment 1 of the invention, FIG. 23 is a diagram showing a production process of a semiconductor device of an embodiment 3 of the invention.

DESCRIPTION OF REFERENCE NUMERALS AND SIGNS

Figure 1:
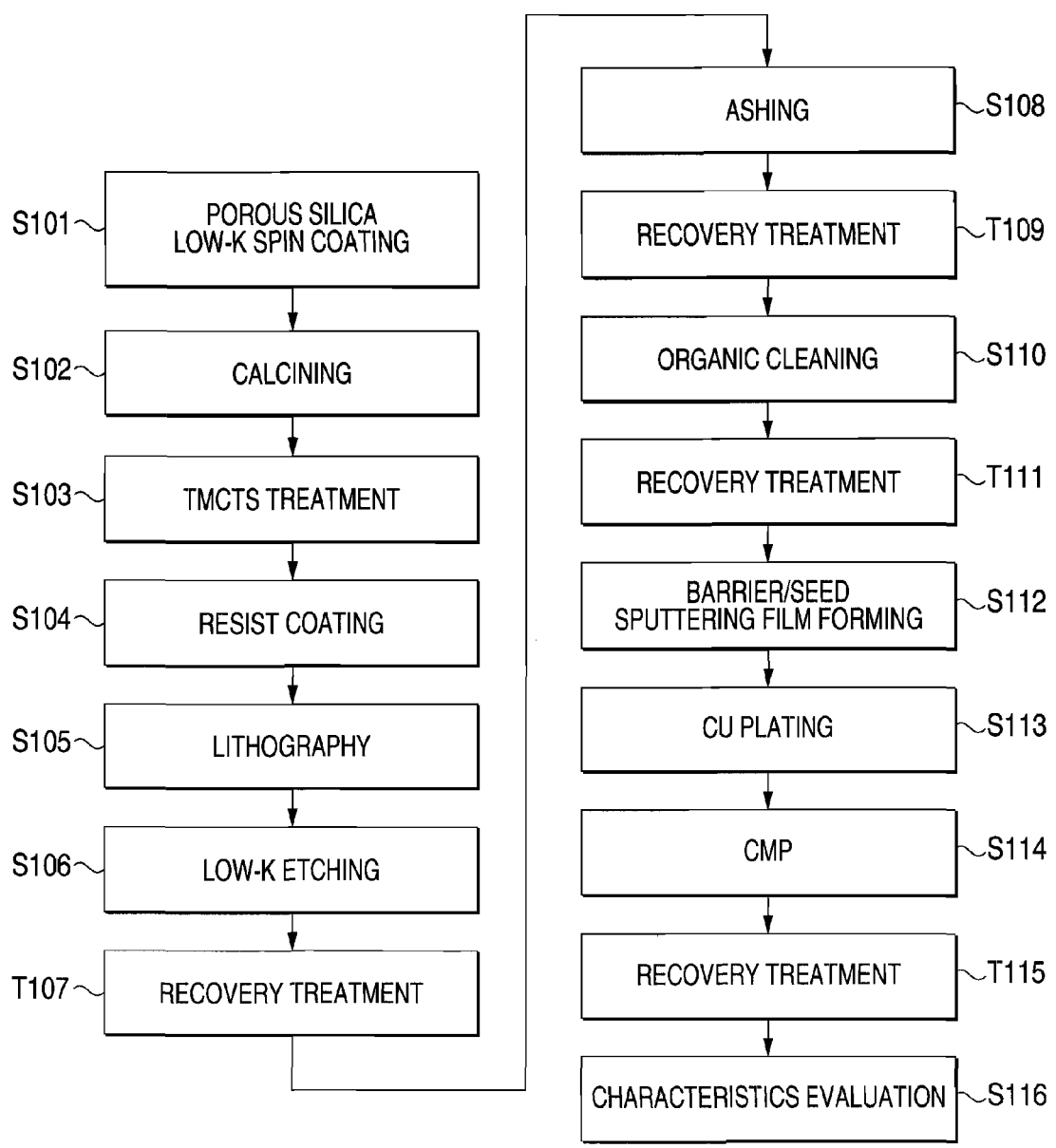
FIG. 1 is a flowchart diagram showing a process of an embodiment 1 of the invention.
Figure 2:
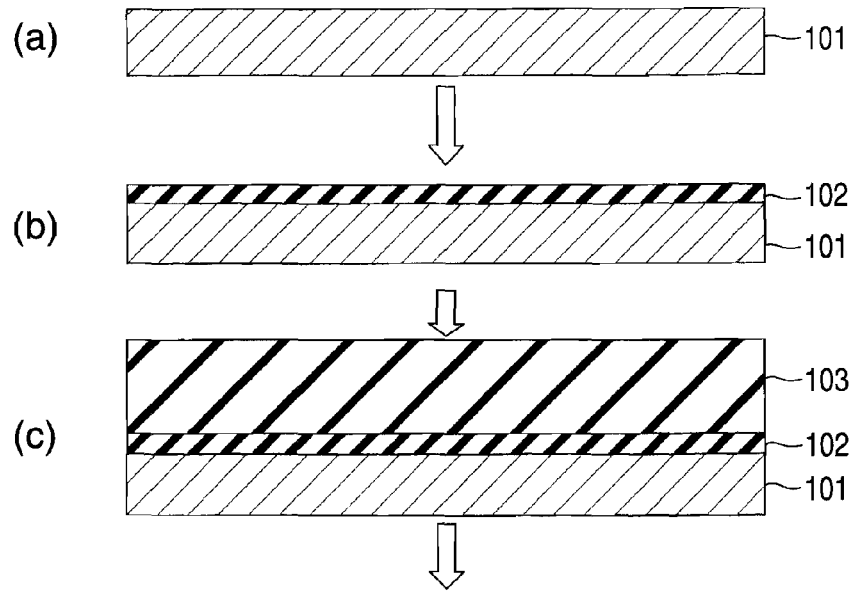
FIG. 2 is a diagram showing a production process of a semiconductor device of the embodiment 1 of the invention.
Figure 3:
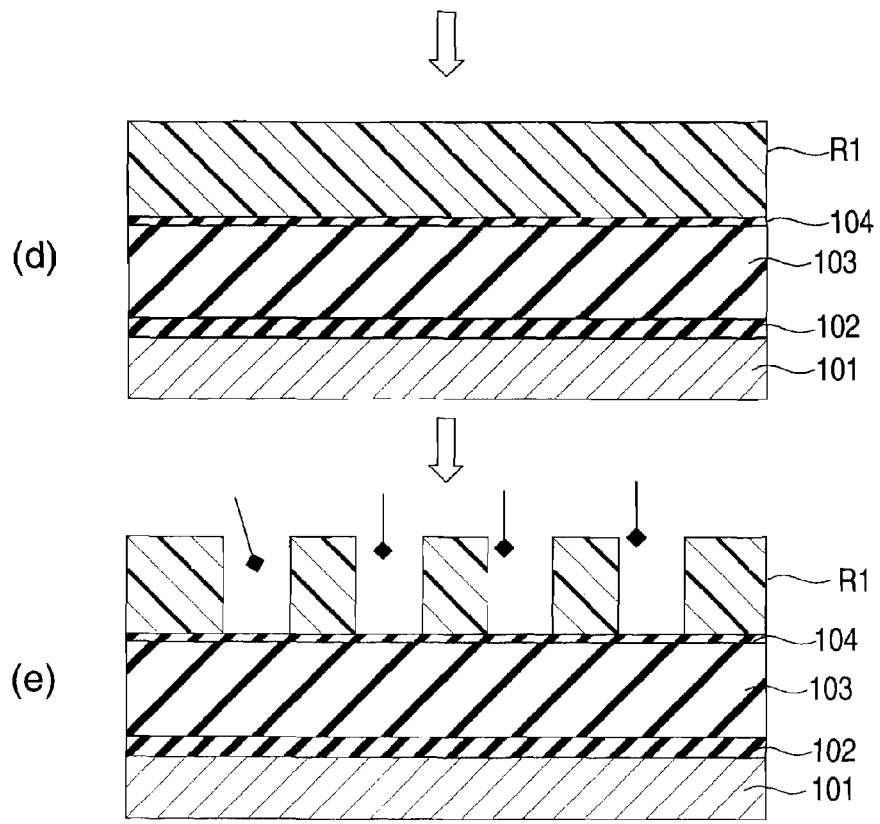
FIG. 3 is a diagram showing a production process of a semiconductor device of the embodiment 1 of the invention.
Figure 4:
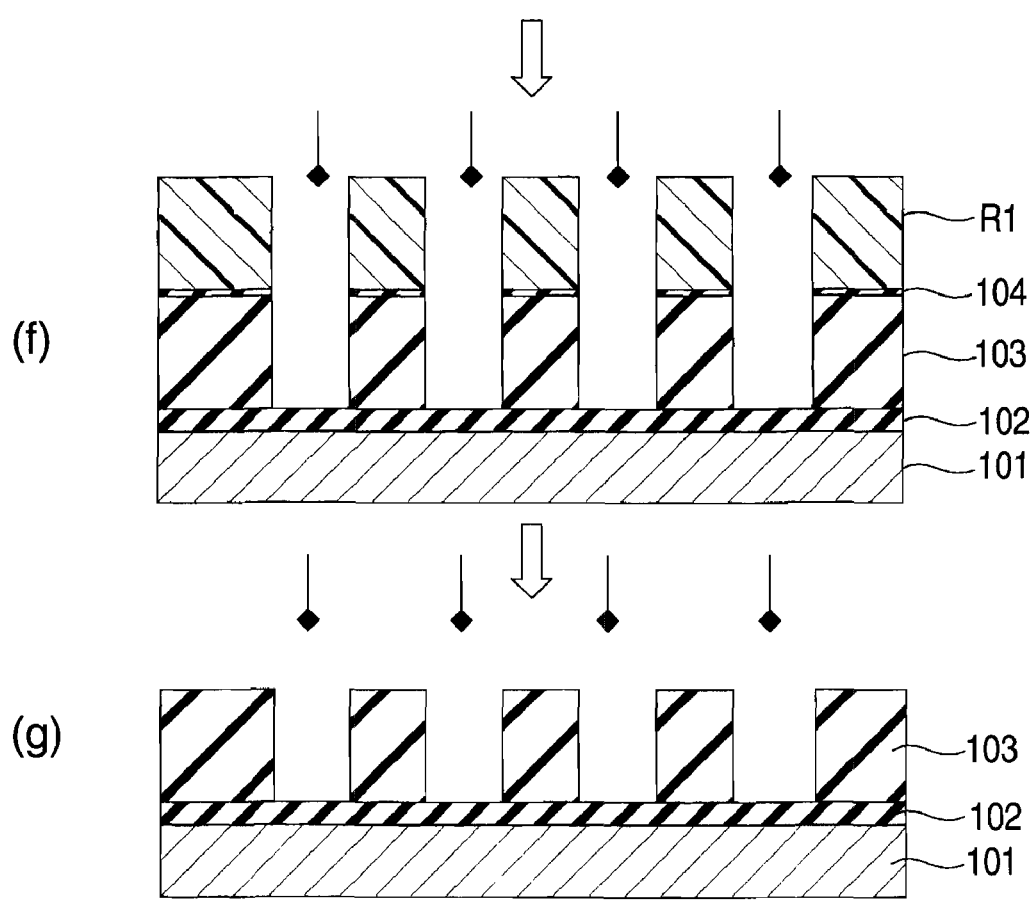
FIG. 4 is a diagram showing a production process of a semiconductor device of the embodiment 1 of the invention.
Figure 5:
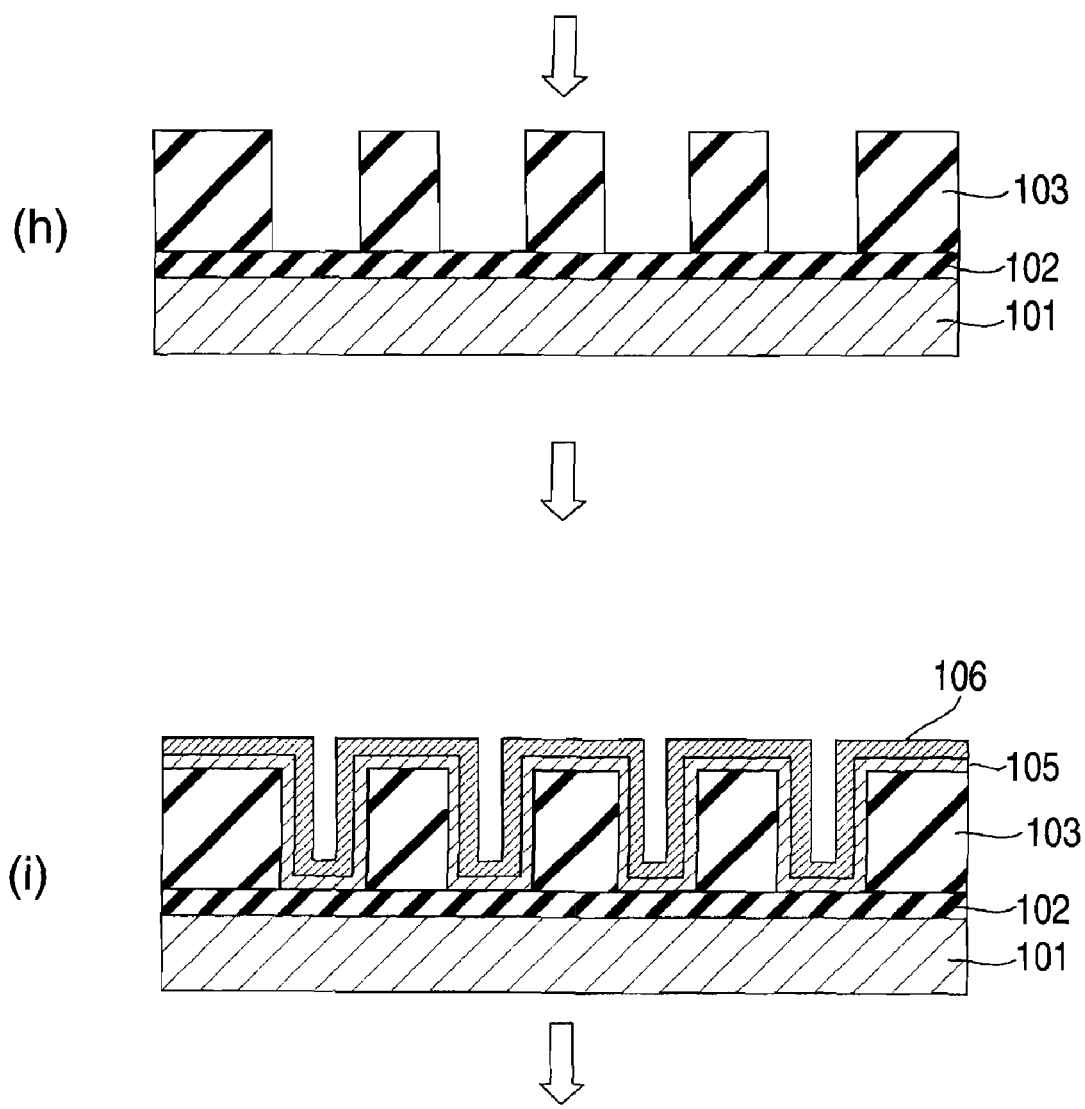
FIG. 5 is a diagram showing a production process of a semiconductor device of the embodiment 1 of the invention.
Figure 6:
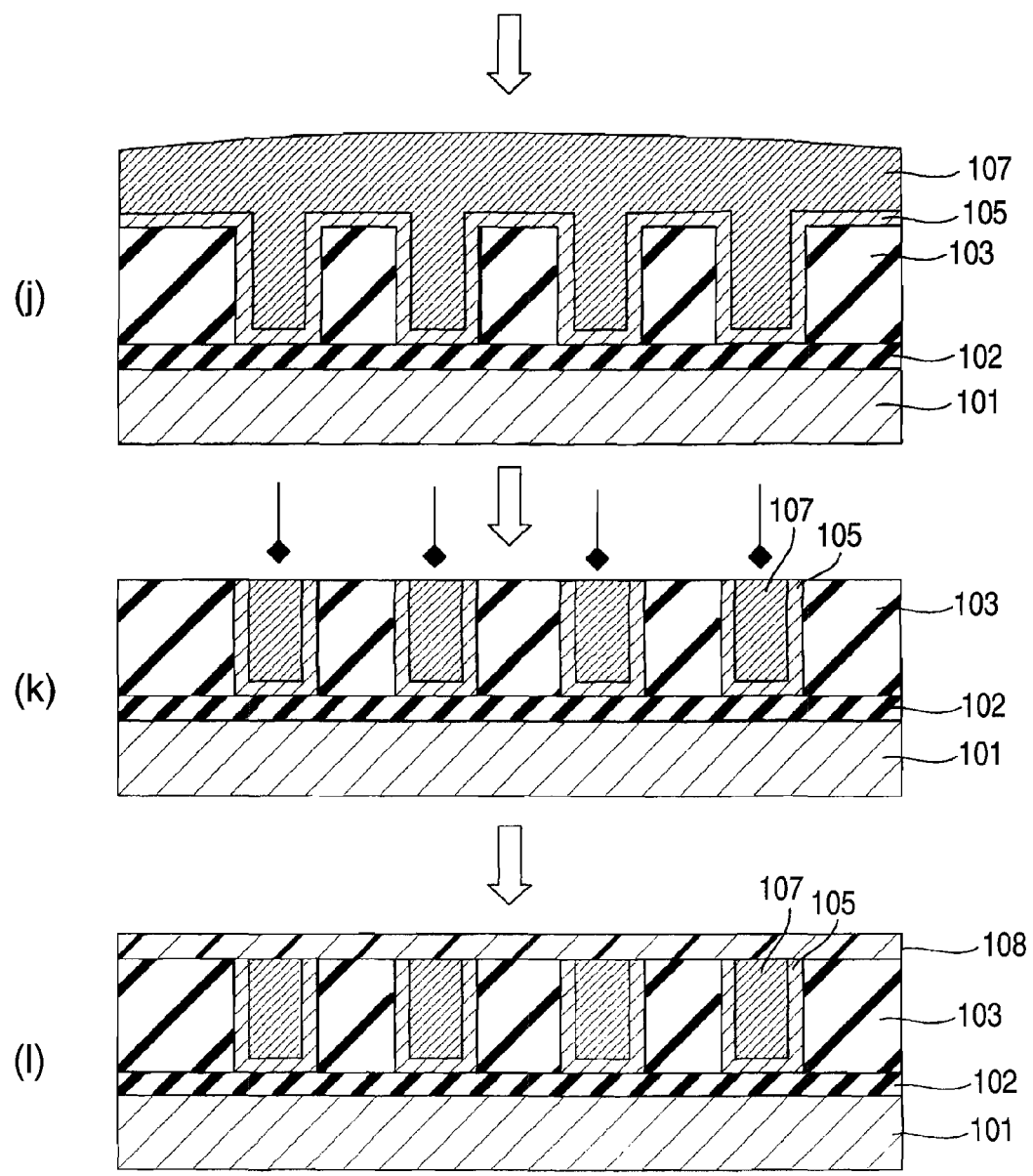
FIG. 6 is a diagram showing a production process of a semiconductor device of the embodiment 1 of the invention.

101: silicon substrate
102: etching stopper layer
103: dielectric thin film
104: antireflective film
105: diffusion barrier film
106: seed film
107: copper plating film
108: cap film
201: silicon oxide film
202: silicon nitride film
203: silicon carbide film

BEST MODE FOR CARRYING OUT THE INVENTION

An embodiment of a manufacturing method of the invention of a semiconductor device will be described in detail with reference to the drawings.

Embodiment 1

As an embodiment 1 of the invention, a manufacturing method of a single damascene wiring structure in which the dielectric thin film is used as an interlayer insulating film of a semiconductor device will be described.

The method, as shown in a flowchart in FIG. 1 and production process diagrams shown in FIGS. 2(a) through 6(i), includes recovery treatment steps (steps T107, T109, T111 and T115) of forming an interlayer insulating film having a single damascene wiring structure from a dielectric thin film made of a mesoporous silica thin film and bringing into contact with TMCTS molecules for every process to recover the process damage.

As the process, except only that, in the existing process, a recovery treatment step for recovering the process damage is added to every process, other processes are similar to that of the production process of a single damascene wiring structure shown in FIGS. 27 through 31.

Figure 7:
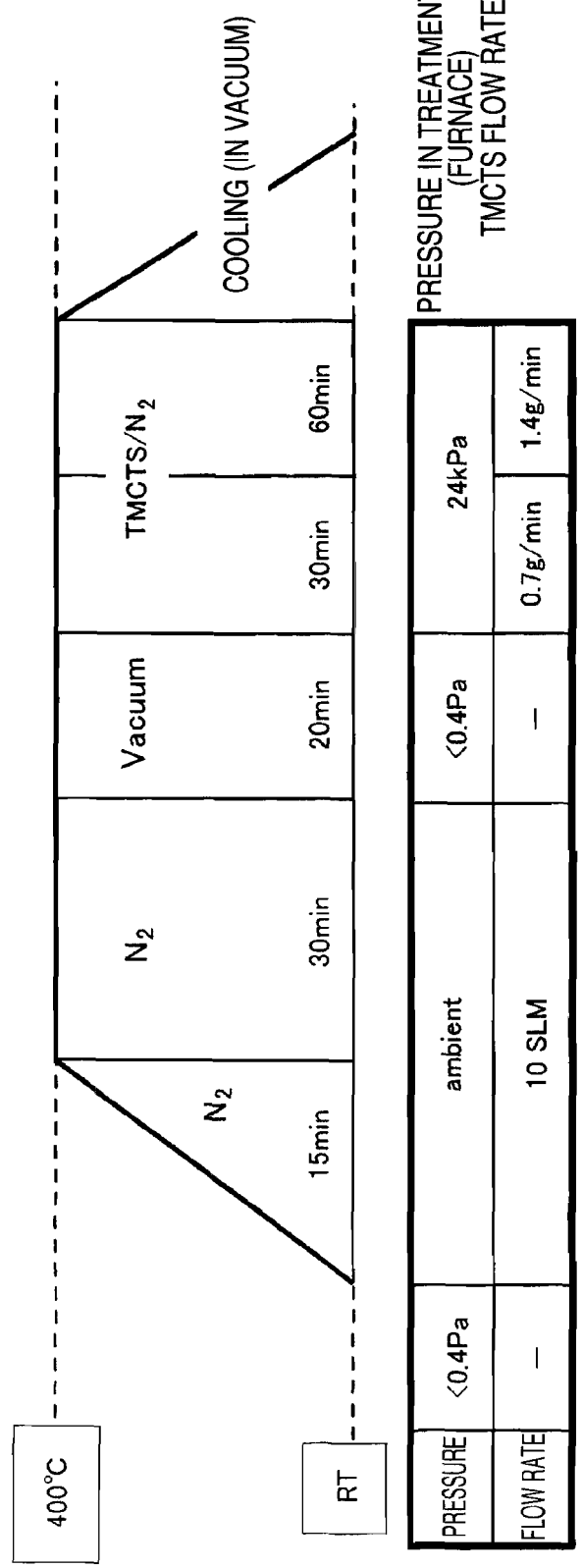
FIG. 7 is an explanatory diagram showing a recovery treatment step used in an embodiment of the invention.

FIG. 7 is a time chart of a recovery process used here. According to the time chart, with nitrogen $N_2$ supplying, a temperature is raised from room temperature to 400° C. in 15 min, followed by keeping 400° C. for 30 min with nitrogen flowing, further followed by stopping supplying nitrogen, still further followed by vacuum suctioning to 0.4 Pa or better and keeping there for 20 min, followed by supplying a mixed gas of $TMCTS/N_2$. For a first 30 min, the mixed gas is supplied at 0.7 g/min and for a second 60 min it is supplied at 1.4 g/min. At this time, pressure is set at 24 kPa.

During the first supply step of nitrogen gas, a residual gas in a chamber is replaced by nitrogen, followed by evacuating, further followed by supplying a mixed gas of $TMCTS/N_2$ to apply a recovery treatment with the mixed gas of $TMCTS/N_2$ flowing.

In what follows, with reference to a flowchart of FIG. 1 and FIGS. 2(a) through 6(l), a formation process of an actual single damascene wiring structure will be described.

In the beginning, as shown in FIG. 2(a), on a surface of a silicon substrate 101 provided with an element region, as shown in FIG. 2(b), a silicon nitride (SiN) film having a film thickness of substantially 50 nm is formed as an etching stopper 102, and, on a top layer thereof, as shown in FIG. 2(c), a porous silica film is formed as a dielectric thin film 103 having low dielectric constant (FIG. 1: S101 and S102).

At the film-forming, same as so far, in a precursor solution obtained by dissolving cationic cetyltrimethylammonium bromide (CTAB: $C_{16}H_{33}N^+(CH_3)_3Br^-$) as a surface active agent, tetraethoxysilane (TEOS) as a silica derivative and hydrochloric acid (HCl) as an acid catalyst in a mixed solvent of $H_2O$/alcohol, a substrate provided with a wiring layer thereon (not shown in the drawing) is soaked and held there at a temperature in the range of 30 to 150° C. for 1 to 120 hr to polymerize the silica derivative due to a hydrolysis and polycondensation reaction (preliminary crosslinking step) to form a periodical self-agglomerate of the surface active agent. The substrate is, after pulling up, washed and dried, followed by heating and calcining at 400° C. for 3 hr in air (nitrogen:oxygen=4:1) to completely pyrolyze and remove the surface active agent of a mold, thereby a pure mesoporous silica thin film is formed as a dielectric thin film 103.

At the time point, the TMCTS treatment described in the FIG. 7 is applied to improve the resistant property of the film (FIG. 1: S103).

Thus, the obtained dielectric thin film 103 is patterned to form contact pores. As shown in FIG. 3(d), after an organic resin film is formed as an antireflective layer 104, a photoresist R1 is coated (FIG. 1: S104).

Subsequently, as shown in FIG. 3(e), pattern exposure due to the photolithography and development are carried out to form a resist pattern R1 (FIG. 1: S105).

In the next place, with the resist pattern R1 as a mask, the dielectric thin film 103 is etched to form a wiring groove T (FIG. 1: S106).

Then, a treatment step shown in FIG. 7 is carried out to supply a processing gas containing TMCTS molecules on a surface including damages due to the etching of the dielectric thin film to apply the recovery treatment to recover a sidewall of the groove (FIG. 4(f), FIG. 1: T107).

Subsequently, the resist pattern R1 is asked to remove and the antireflective film 104 is etched to remove (FIG. 1: A108).

The treatment step shown in FIG. 7 is once more applied to supply a processing gas containing TMCTS molecules on a surface containing damages due to the asking of the resist pattern R1 to apply the recovery treatment (FIG. 4(g): T109).

Subsequently, a CF deposit film on a sidewall of the wiring groove due to the etching is removed, an organic solvent is used to wash to remove damages, thereby a surface is cleansed (FIG. 1: S110).

Furthermore, the treatment step shown in FIG. 7 is applied to supply a processing gas containing TMCTS molecules on a surface containing damages due to the cleaning with an organic solvent to carry out the recovery treatment (FIG. 5(h), FIG. 1: T111).

Then, on the cleansed surface, by means of the PVD, CVD or the like method, tantalum nitride (TaN) as a diffusion inhibition barrier film 105 and a copper thin film as a seed film 106 for copper plating are formed (FIG. 5(i)) (FIG. 1: S112).

Subsequently, as shown in FIG. 6(j), by means of the electroplating method, on the Cu seed layer, a copper plating layer is formed as a wiring layer 107 (FIG. 1: S113).

At the last, the surface is flattened by the CMP to polish and remove excess copper plating layer and seed film 106 (FIG. 1: S114).

Furthermore, the treatment step shown in FIG. 7 is applied to supply a processing gas containing TMCTS molecules on a surface containing damages due to the CMP to carry out the recovery treatment (FIG. 6(k), FIG. 1: T115).

At the last, a wiring layer is formed in the wiring groove, followed by forming, as shown in FIG. 6(l), a SiN film as a cap film, further followed by evaluating the characteristics (FIG. 1: S116).

Since the dielectric constant substantially as designed can be thus obtained, a wiring structure small in the parasite capacitance, free from the leakage current, high in the reliability and having a flat surface can be obtained.

Furthermore, when the damages due to the respective processes are recovered by the recovery treatment, the patterning can be applied, not with the hard mask but with direct use of the resist pattern, with the characteristics maintained sufficiently. Accordingly, more precise patterning can be obtained.

Still furthermore, since the dielectric thin film sufficiently high in the mechanical strength can be obtained, the CMP can be applied to sufficiently flatten.

In the next place, results of experiments carried out for verifying advantages of the recovery treatment will be shown.

FIG. 8 is a correspondence table between signs and treatments that show the respective treatment steps.

In the beginning, measurements of thickness variations after the respective treatments will be described.

(On Film Thickness Variation)

As shown in FIG. 9, an average value of film thicknesses of dielectric thin films 103 after the step of FIG. 2(c) where the TMCTS treatment is applied immediately after the film-forming as a reference was 327 nm.

As the ashing process, three kinds, that is, the $CF_4/O_2$ ashing followed by $O_2$ ashing as shown by A1 in FIG. 8, the $CF_4/O_2$ ashing as shown by A2 and the $O_2$ ashing as shown by A3 are carried out. After the respective ashing processes, the recovery treatment (T) with TMCTS molecules such as shown in FIG. 7 is applied. Results are shown with A1+T, A2+T and A3+T.

As the results, it is found that although the film thicknesses are lowered by substantially 10% due to the $CF_4/O_2$ ashing process (A1, A2), ones after the recovery treatment, which are shown by the A1+T and A2+T, are only slightly increased in the film thickness.

Furthermore, it is found that, although in the $O_2$ ashing process (A3), the film thickness is hardly damaged, one after the recovery treatment, which is shown by A3+T, is slightly reduced in the film thickness.

In the next place, an affect of the organic cleaning treatment (WC) on the film thickness was measured as well.

From the results, it is found that although the film thickness is hardly affected by the organic cleaning treatment, one after the recovery treatment, which is shown by WC+T, is slightly reduced in the film thickness.

Furthermore, one in a state after the treatment in a half-etching step with $Ar/C_5F_8/O_2$ is shown by HE and shows a reduction in the film thickness. However, one after the recovery treatment shown by the HE+T is only slightly reduced in the film thickness.

(On Variation of Refractive Index)

Figure 10:
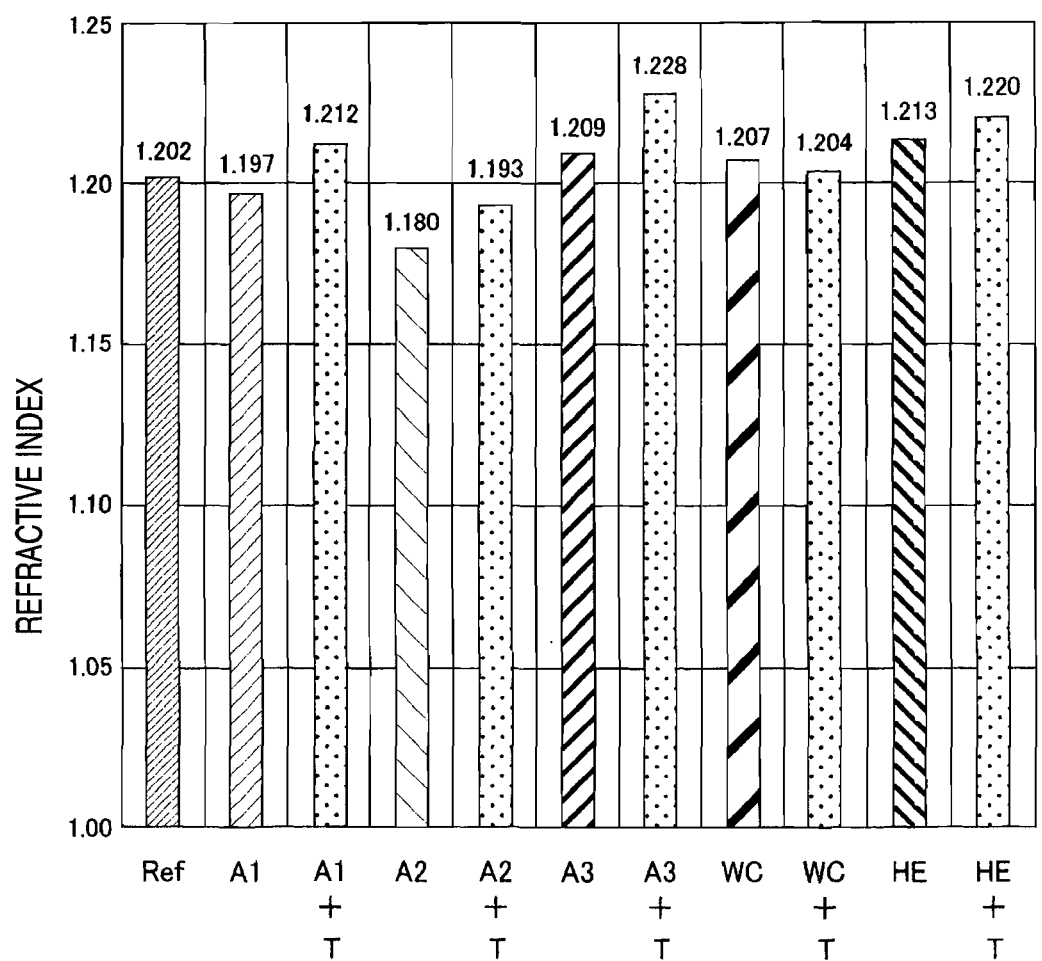
FIG. 10 is an explanatory diagram of an advantage due to the recovery treatment used in the embodiment 1 of the invention.

In the next place, measurements of the refractive index are shown in FIG. 10.

As shown in FIG. 10, the refractive index of a dielectric thin film 103 after the step shown by FIG. 2(c) where the TMCTS treatment is applied immediately after the film-forming as a reference was 1.202.

Similarly to the ashing process, three kinds, that is, the $CF_4/O_2$ ashing followed by $O_2$ ashing as shown by A1 in FIG. 8, the $CF_4/O_2$ ashing as shown by A2 and the $O_2$ ashing as shown by A3 were carried out. After the respective ashing steps, the recovery treatment (T) with TMCTS molecules such as shown in FIG. 7 was applied. Results are shown with A1+T, A2+T and A3+T.

As the result, it is found that although the refractive index is reduced due to the $CF_4/O_2$ ashing (A1, A2), ones after the recovery treatments shown by A1+T and A2+T show an increase in the refractive index, that is, owing to inclusion of the TMCTS, the film density is increased.

Furthermore, in the $O_2$ ashing (A3), the refractive index is increased relative to the film thickness. This is considered due to deterioration of the hydrophobicity. One after the recovery treatment shown by A3+T shows a further increase in the refractive index.

Still furthermore, an affect of the organic cleaning treatment (WC) on the refractive index was measured as well.

As the result, it is found that neither one after the organic cleaning treatment nor one further followed by the recovery treatment shown by WC+T show variation in the refractive index.

Furthermore, one in a state after the treatment in a half-etching step with $Ar/C_5F_8/O_2$ is shown with a mark HE. Neither one in this state nor one after the recovery treatment shown by HE+T hardly show variation in the refractive index.

(On Variation of Dielectric Constant (k Value))

Figure 11:
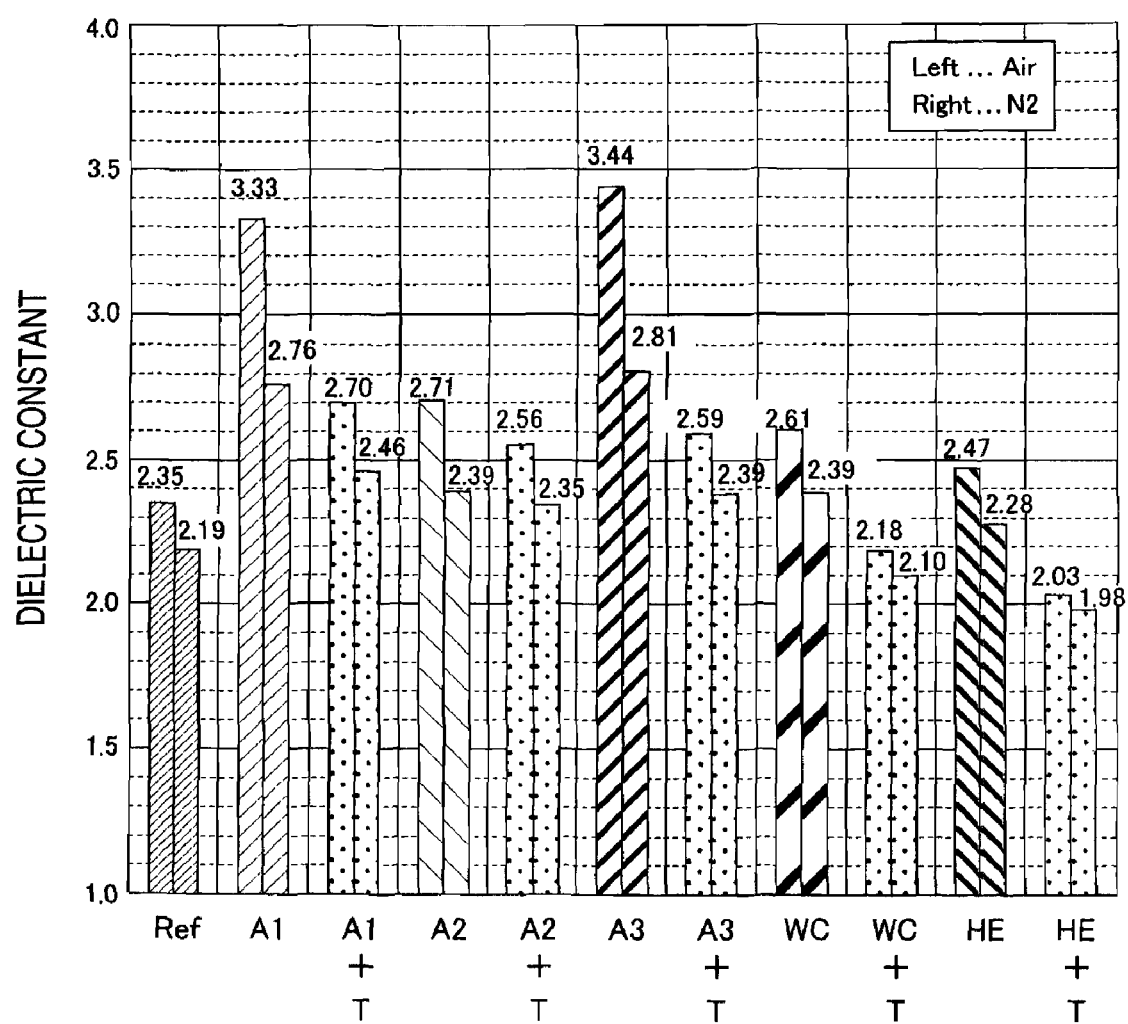
FIG. 11 is an explanatory diagram of an advantage due to the recovery treatment used in the embodiment 1 of the invention.

In the next place, measurements of the dielectric constant are shown in FIG. 11.

As shown in FIG. 11, the dielectric constant of a dielectric thin film 103 after the step shown by FIG. 2(c) where the TMCTS treatment is applied immediately after the film-forming as a reference was 2.35 in air and 2.19 in a nitrogen atmosphere. Left sides in FIG. 11 show measurement values in air and right sides therein show measurement values in a nitrogen atmosphere.

Similarly to the ashing process, three kinds, that is, the $CF_4/O_2$ ashing followed by $O_2$ ashing as shown by A1 in FIG. 8, the $CF_4/O_2$ ashing as shown by A2 and the $O_2$ ashing as shown by A3 were carried out. After the respective ashing processes, the recovery treatment (T) with TMCTS molecules such as shown in FIG. 7 was applied. Results are shown with A1+T, A2+T and A3+T.

The k values are, though deteriorated in the respective processes, largely recovered due to the recovery treatment. In the organic cleaning and half-etching, the k values are recovered to an initial value or less by the recovery treatment.

Figure 12:
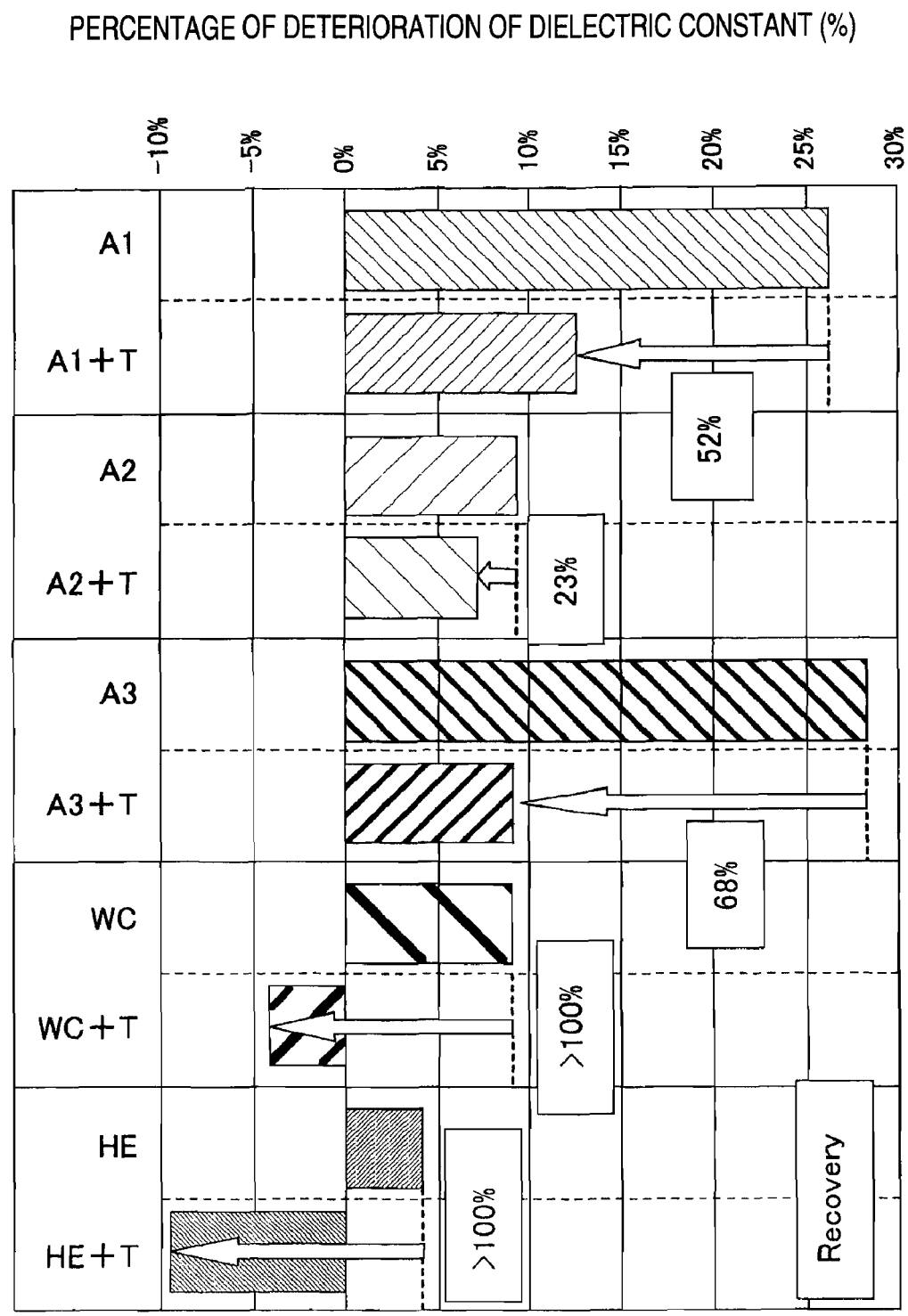
FIG. 12 is an explanatory diagram of an advantage due to the recovery treatment used in the embodiment 1 of the invention.

That is, it is found that, as the variation rates of the dielectric constant are shown in FIG. 12, the dielectric constant increase in the range of 9 to 28% due to the respective ashing processes (A1, A2, A3), by 9% due to the organic cleaning (WC) and by 4% due to the HE. However, ones after the recovery treatment shown by A1+T, A2+T and A3+T show recovery in the range of 23 to 68%.

(In-plane Distribution)

In the next place, the in-plane distribution of the dielectric constant of each of the dielectric thin films is measured and results are shown in FIGS. 13(a) and 13(b). FIG. 13(a) shows the dielectric constant (k value) after the respective treatments, FIG. 13(b) shows the dielectric constant (k value) after the recovery treatment, and horizontal axes in FIGS. 13(a) and 13(b) show a distance (mm) from a wafer center.

It is found that there is no remarkable axis direction dependency (in-plane distribution) in deteriorations of the k values after the respective processes and, in the ashing treatments A1 and A3 including the $O_2$ ashing, a wafer edge portion is less deteriorated.

(Leakage Current)

Figure 14:
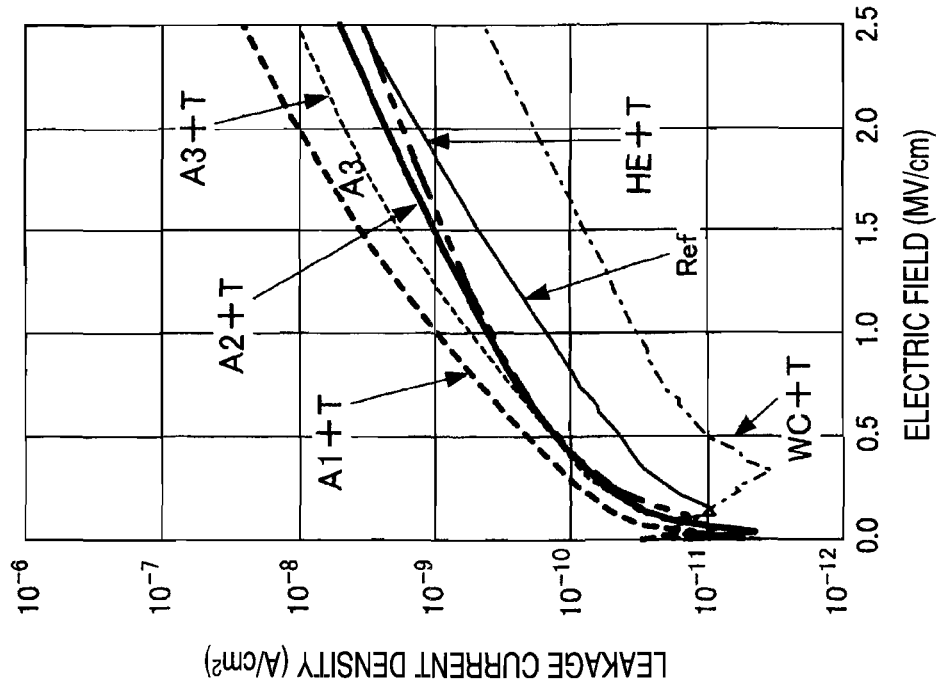
FIG. 14 is an explanatory diagram of an advantage due to the recovery treatment used in the embodiment 1 of the invention.
Figure 14:
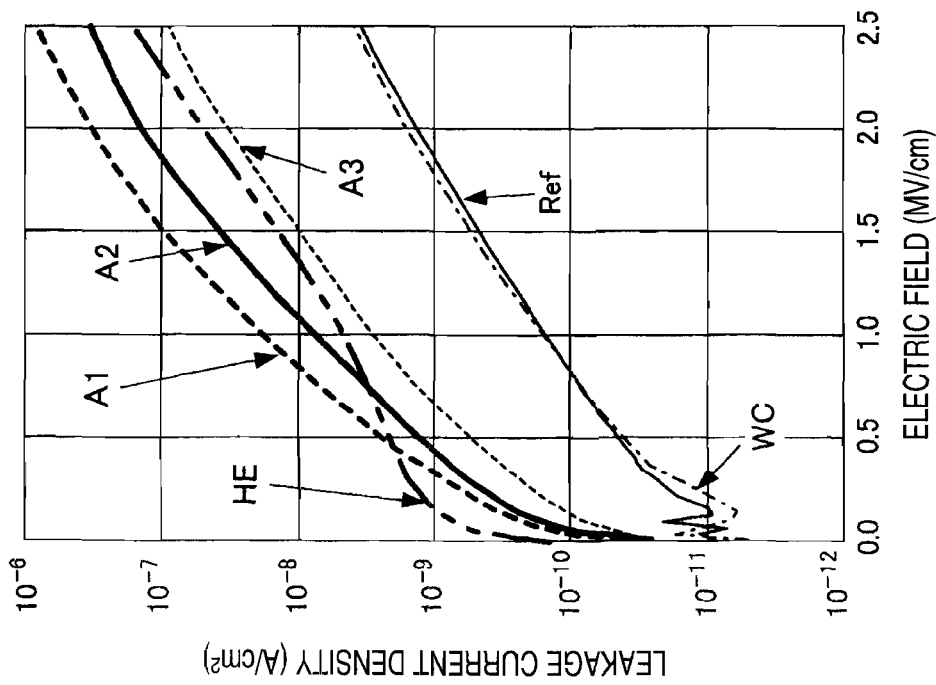

In the next place, a leakage current of each of the dielectric thin films was measured and results are shown in FIGS. 14(a) and 14(b). FIG. 14(a) shows the leakage currents after the respective treatments, FIG. 14(b) shows the leakage currents after the recovery treatment, and horizontal axes in FIGS. 14(a) and 14(b) show a magnitude of an electric field (MV/cm).

In the case of the organic cleaning, the leakage current is substantially same, that is, does not deteriorate. However, in the asking processes (A1, A2, A3) and the HE process, the leakage current increases. When the recovery treatment (T) is applied thereto, as shown by A1+T, A2+T and A3+T, a large recovery is found.

(Elastic Modulus, Hardness)

In the next place, the elastic modulus and hardness of each of the dielectric thin films are measured and results are shown in FIGS. 15(a) and 15(b).

In FIGS. 15(a) and 15(b), measurements of rates of change of the elastic modulus (E value) and hardness (H value) after the respective treatments and the recovery treatment are shown. FIG. 15(c) shows the respective measured data.

(Relationship between Hardness, Elastic Modulus and Dielectric Constant)

Figure 16:
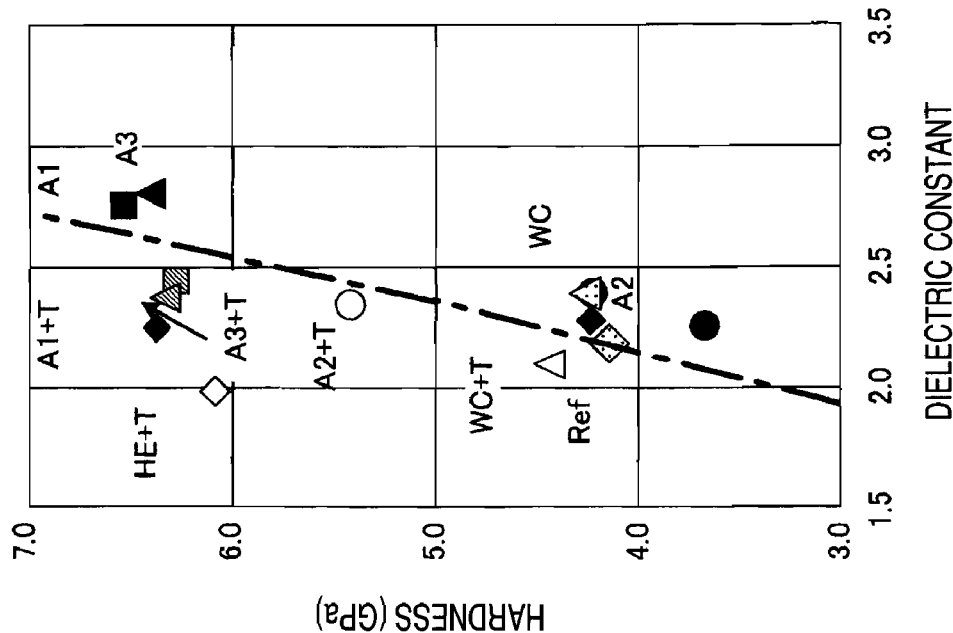
FIG. 16 is an explanatory diagram of an advantage due to the recovery treatment used in the embodiment 1 of the invention.
Figure 16:
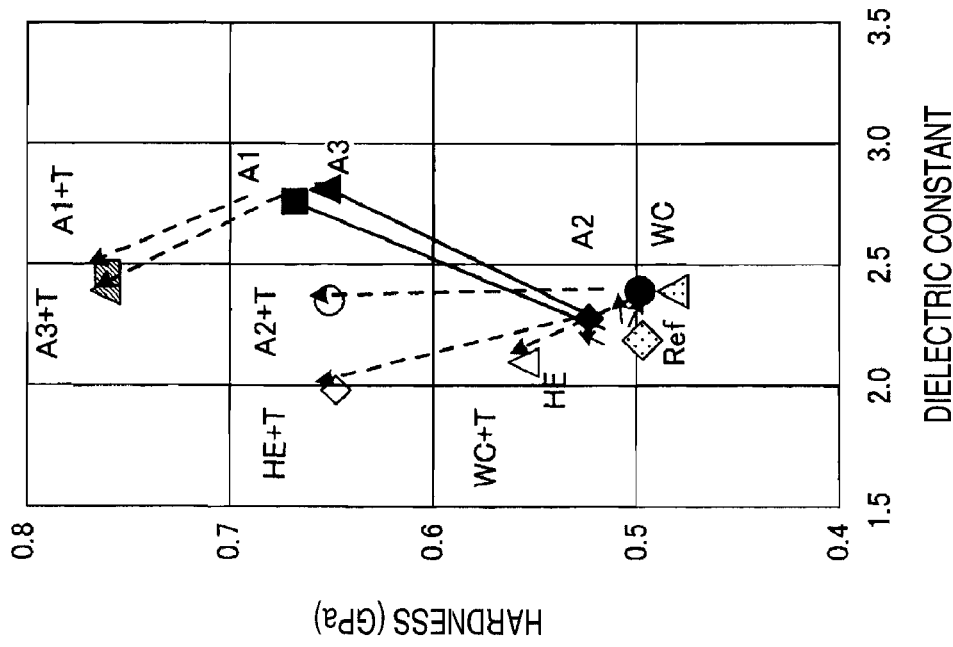
Figure 17:
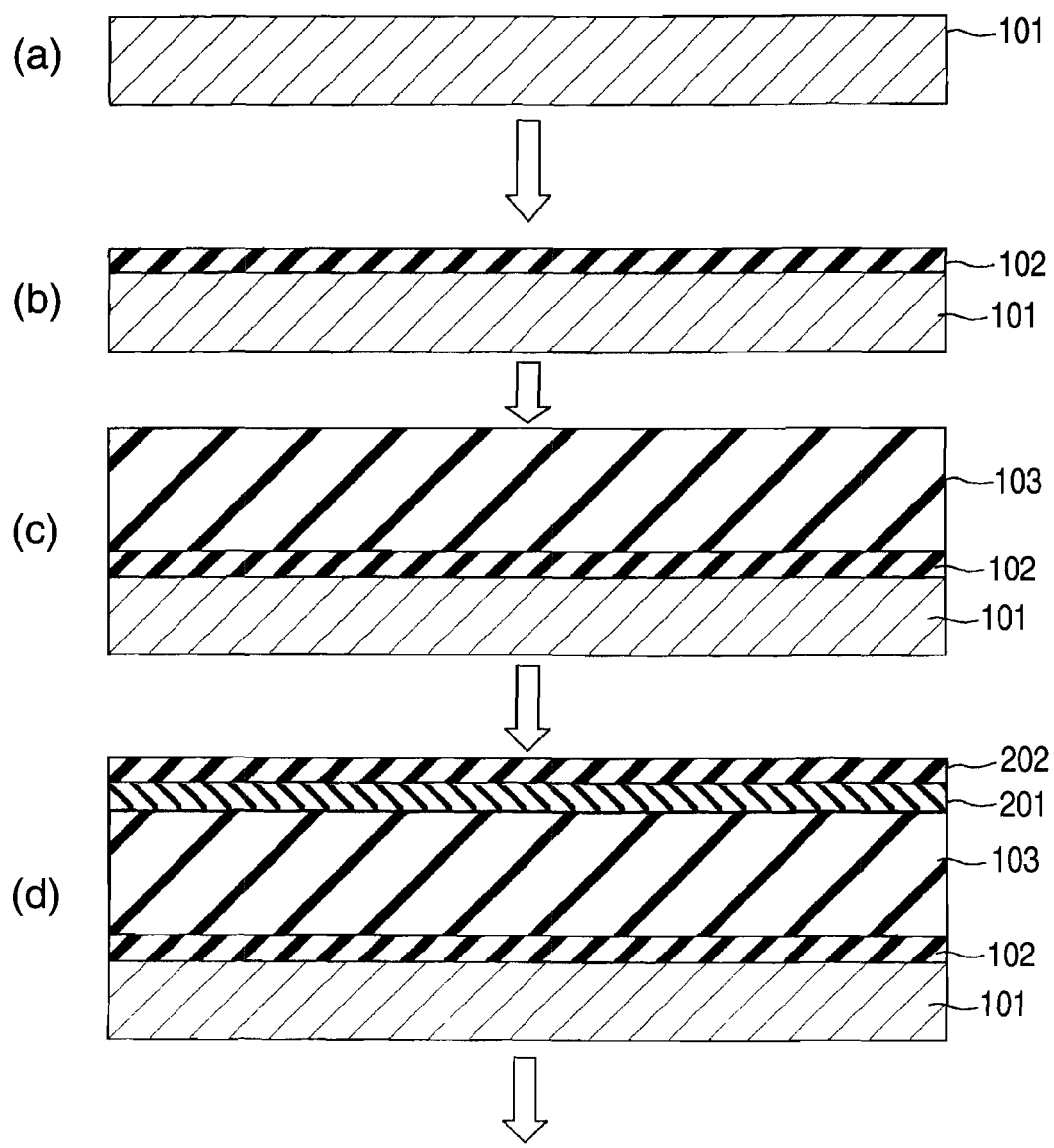
FIG. 17 is a diagram showing a production process of a semiconductor device of an embodiment 2 of the invention.
Figure 18:
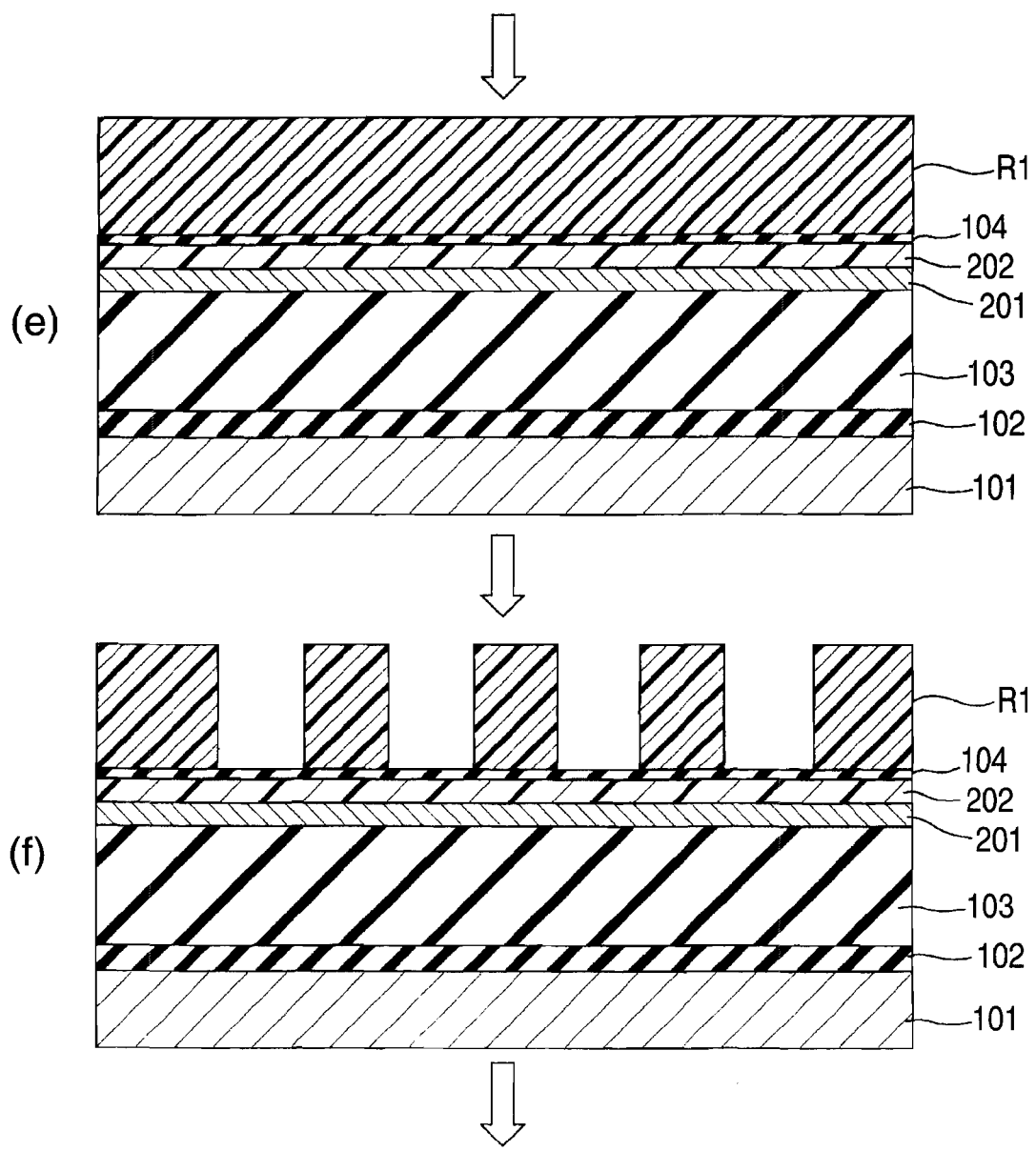
FIG. 18 is a diagram showing a production process of a semiconductor device of an embodiment 2 of the invention.
Figure 19:
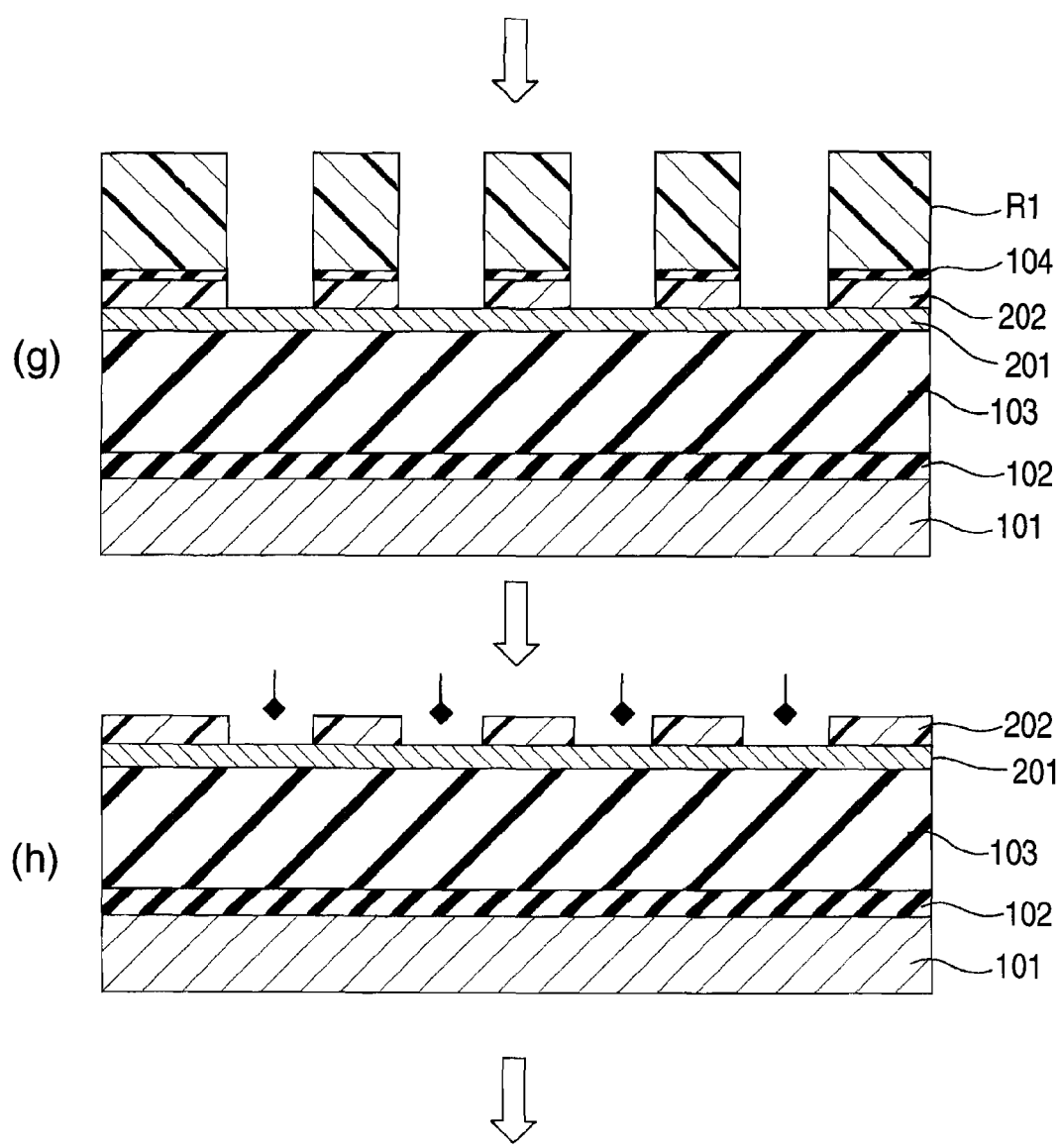
FIG. 19 is a diagram showing a production process of a semiconductor device of an embodiment 2 of the invention.

In the next place, in order to obtain the relationship between the hardness, elastic modulus and dielectric constant of the dielectric thin films, the relationships between the hardness, elastic modulus and dielectric constant of the dielectric thin films were measured and results are shown in FIGS. 16(a) and 16(b).

In FIG. 16(b), ones of which k values are smaller than a straight line of Ew=17.5 GPa corresponding to the elastic modulus and k value of the dielectric thin film immediately after the film-forming, that is, ones located on a left side are improved films. As obvious from the drawing, it is found that ones after the recovery treatment all are present on a left side and exert excellent characteristics.

Embodiment 2

In the embodiment 1, a production process of a semiconductor device, which contains a step where a groove is formed in an interlayer insulating film with a resist pattern as a mask was described. In the present embodiment, formation of a groove by use of a hard mask having a two-layered structure will be described. In the embodiment as well, similarly, a manufacturing method of a single damascene wiring structure will be described.

The method is similar to one that is described in the embodiment 1 only except that, as production process charts are shown in FIGS. 17(a) through 21(n), as a hard mask, a two-layer structure mask made of a silicon oxide film 201 and a silicon nitride film 202 is used. In the method, an interlayer insulating film of the single damascene wiring structure is formed of a dielectric thin film made of a mesoporous silica thin film and an individual process includes a recovery treatment where TMCTS molecules are brought into contact to recover the process damages.

In the embodiment, since a two-layer structure hard mask is used, steps where the dielectric thin film is exposed and damaged are etching the dielectric thin film itself (FIG. 20(i)) and an organic cleaning step after the etching (FIG. 20(j)). Accordingly, in the embodiment, after the two steps, a recovery treatment is carried out. The recovery process is carried out according to a time chart shown in FIG. 7.

In what follows, with reference to FIGS. 17(a) through 21(n), forming a single damascene wiring structure that uses a two-layer structure hard mask will be described.

In the beginning, as shown in FIGS. 17(a) through 17(c), similarly to the embodiment 1, on a surface of a silicon substrate 101 on which an element region is formed, a silicon nitride (SiN) film having a film thickness of substantially 50 nm is formed as an etching stopper 102, followed by forming thereon a porous silica thin film as a low dielectric constant dielectric thin film 103.

Subsequently, as shown in FIG. 17(d), a silicon oxide film 201 and a silicon nitride film 202 are formed by means of the CVD method to form a two-layer structure hard mask.

After that, similarly, as shown in FIG. 18(e), an organic resin film is formed as an antireflective film 104, followed by coating a photoresist R1.

Subsequently, as shown in FIG. 18(f), similarly to the embodiment 1, by use of the photolithography, pattern exposure and development are applied to form a resist pattern R1.

After that, as shown in FIG. 19(g), with the silicon oxide film 201 that is a first layer hard mask remained, only the antireflective film 104 and silicon nitride film 202 are patterned.

Subsequently, as shown in FIG. 19(h), with the silicon oxide film 201 remained, the resist pattern R1 is removed by means of the $O_2$ ashing. At this time, the dielectric thin film 103 does not come into contact with $O_2$ plasma; accordingly, it is hardly damaged. However, in some cases, the dielectric thin film 103 is slightly damaged through the silicon oxide film 201. Accordingly, it is desirable to apply the recovery treatment shown in FIG. 7 after the ashing.

After that, the silicon oxide film 201 that is a hard mask on a lower layer side and the dielectric thin film 103 are continuously etched. Subsequently, the treatment step shown in FIG. 7 is applied to supply a processing gas containing the TMCTS molecules on a surface containing damages due to the etching of the dielectric thin film to apply the recovery treatment to recover a groove sidewall (FIG. 20(*i*)).

Subsequently, a CF deposit film on a sidewall of the wiring groove due to the etching is removed, a cleaning step is applied with an organic solvent to remove damages to cleanse a surface, the treatment step shown in FIG. 7 is further applied to supply a processing gas containing the TMCTS molecules on a surface containing damages due to the washing with an organic solvent to apply the recovery treatment step (FIG. 20(*j*)).

Figure 20:
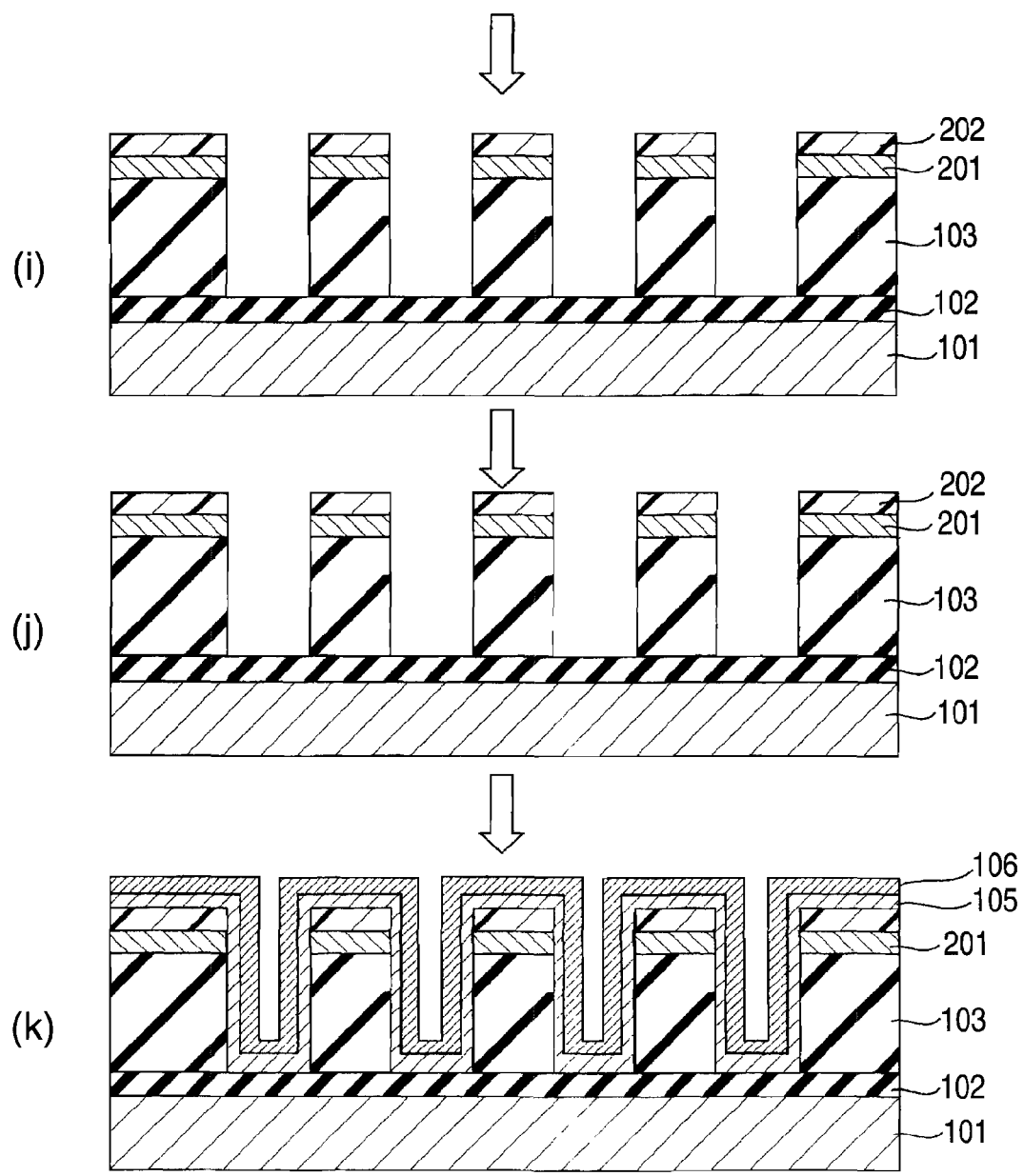
FIG. 20 is a diagram showing a production process of a semiconductor device of an embodiment 2 of the invention.

In the next place, on a cleansed surface, by means of the PVD method or CVD method, as a diffusion inhibition barrier film 105, tantalum nitride (TaN) is formed, followed by forming a copper thin film as a seed layer 106 for copper plating (FIG. 20 (*k*)).

Steps after that are similar to the embodiment 1 except that on a top layer of a dielectric thin film 103 a silicon oxide film 201 and a silicon nitride film 202 that are used as a hard mask remain in a stacked state.

Figure 21:
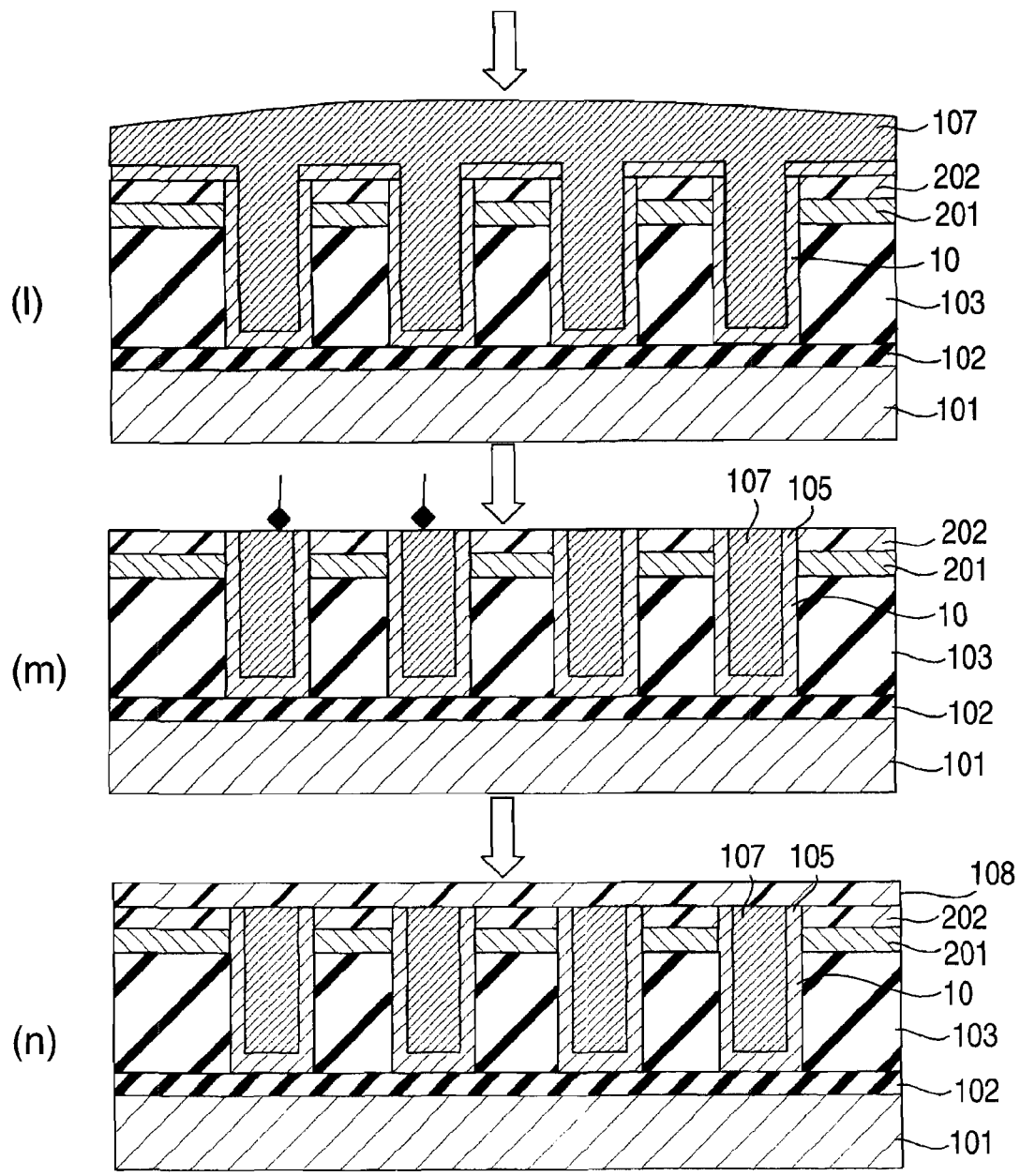
FIG. 21 is a diagram showing a production process of a semiconductor device of an embodiment 2 of the invention.

After the respective treatment steps are thus carried out, through steps of FIGS. 21(*l*) through 21(*n*), a wiring layer is formed in a wiring groove, followed by finally forming a SiN film as a cap film, further followed by evaluating the characteristics.

Thus, the dielectric constant substantially as designed can be obtained. Accordingly, a wiring structure sufficiently small in the parasite capacitance, free from the leakage current, high in the reliability and having a flat surface can be obtained.

In the embodiment 2, a hard mask with a two-layer structure is used; accordingly, the process damage is a little small.

Embodiment 3

In the embodiment 2, a manufacturing step of a semiconductor device, which contains a step where a groove is formed in an interlayer insulating film with a two-layer structure hard mask as a mask was described. In the present embodiment, formation of a groove with a single-layer hard mask will be described. In the embodiment as well, similarly, a manufacturing method of a single damascene wiring structure will be described.

Figure 22:
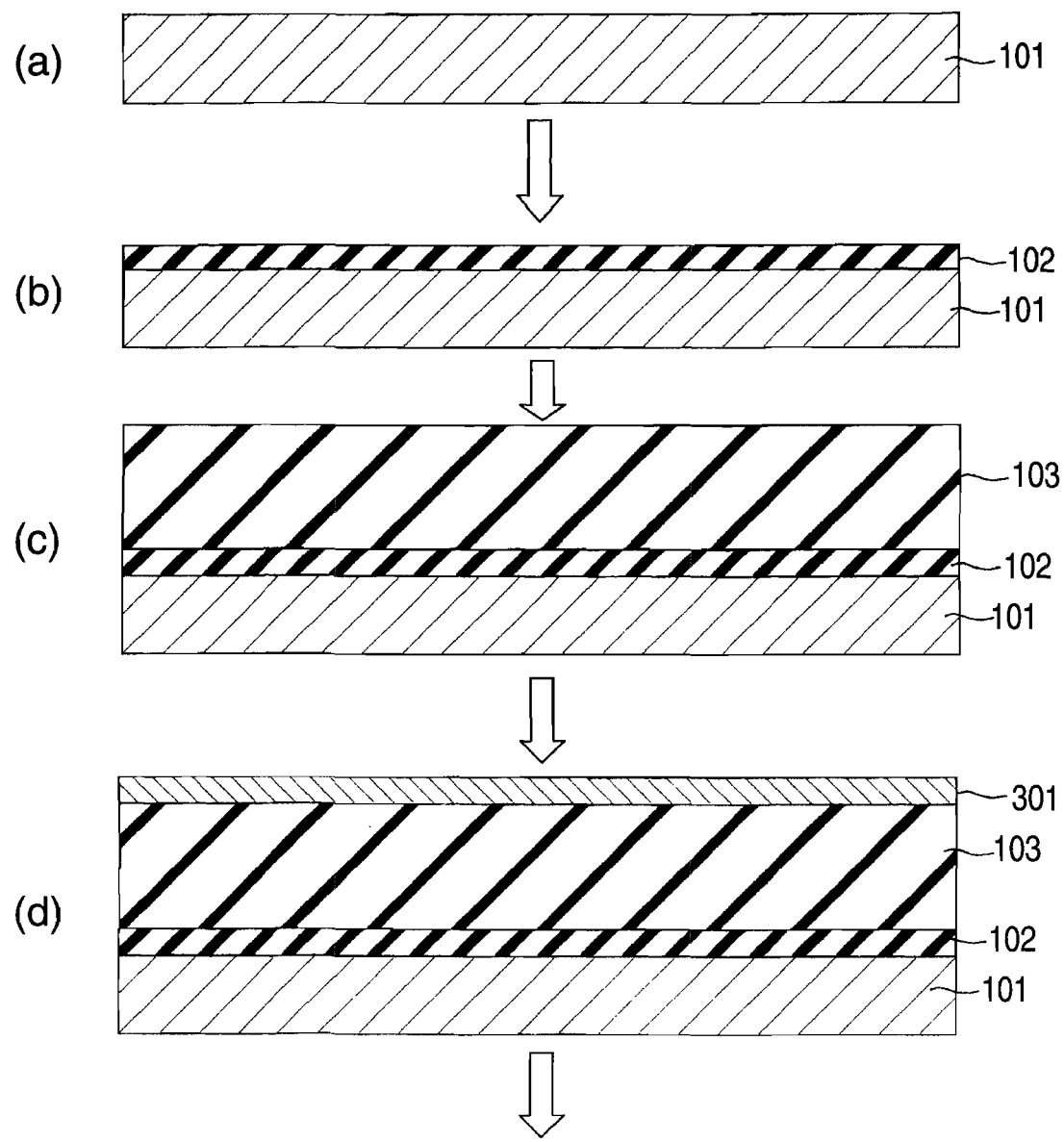
FIG. 22 is a diagram showing a production process of a semiconductor device of an embodiment 3 of the invention.

The method is similar to that described in the embodiment 2 only except that, as production process charts are shown in FIGS. 22(*a*) through 26(*n*), as a hard mask, a silicon carbide film 301 is used. In the method, an interlayer insulating film having the single damascene wiring structure is formed of a dielectric thin film made of a mesoporous silica thin film and an individual process includes a recovery treatment step where the dielectric thin film is brought into contact with TMCTS molecules to recover the process damages.

In the embodiment, a single layer structure hard mask is used. Accordingly, in comparison with a case where the two-layer structure hard mask is used, the dielectric thin film is exposed in the ashing step of the resist pattern (FIG. 24(*h*)), resulting in an increase in steps where damages are caused. As the result, after the ashing step of the resist pattern as well, a recovery treatment step becomes necessary. Still furthermore, after that, similarly to the embodiment 2, the steps in which damage is given are an etching step of the dielectric thin film itself (FIG. 25(*j*) and an organic cleaning step after the etching (FIG. 25(*k*)), and after the two steps the recovery treatment step is carried out. Furthermore, the recovery step is carried out according to the time chart shown in FIG. 7.

In what follows, with reference to FIGS. 22(*a*) through 26(*n*), forming a single damascene wiring structure with a single layer structure hard mask will be described.

In the beginning, as shown in FIGS. 22(*a*) through 22(*c*), similarly to the embodiments 1 and 2, on a surface of a silicon substrate 101 on which an element region is formed, a silicon nitride (SiN) film having a film thickness of substantially 40 nm is formed as an etching stopper 102, followed by forming thereon a porous silica thin film as a low dielectric constant dielectric thin film 103.

Subsequently, as shown in FIG. 22(*d*), a silicon carbide film (SiC) 301 is formed by means of the CVD method to form a single-layer structure hard mask. As the materials of the hard mask, other than SiC, SiOC, SiO or the like can be applied.

After that, similarly, as shown in FIG. 23(*e*), an organic resin film is formed as an antireflective film 104, followed by coating a photoresist R1.

Subsequently, as shown in FIG. 23(*f*), similarly to the embodiments 1 and 2, by use of the photolithography, pattern exposure and development steps are applied to form a resist pattern R1.

Figure 24:
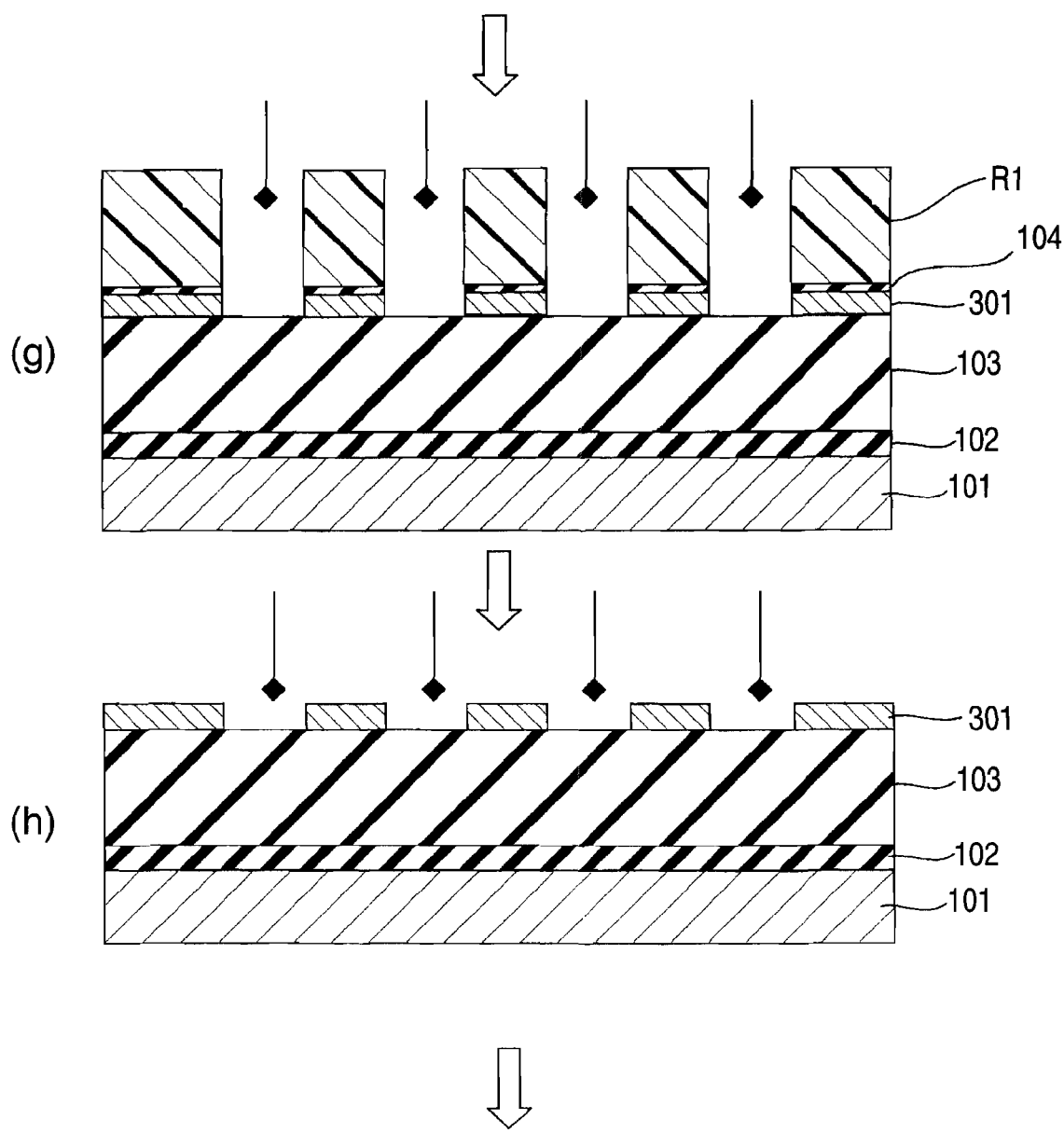
FIG. 24 is a diagram showing a production process of a semiconductor device of an embodiment 3 of the invention.

After that, as shown in FIG. 24(*g*), the antireflective film 104 and silicon carbide film 301 that is a mask are patterned.

Subsequently, the resist pattern R1 is removed by means of the $O_2$ ashing. At this time, a surface of the dielectric thin film is damaged due to $O_2$ plasma; accordingly, it is desirable to apply the recovery treatment shown in FIG. 7 after the ashing (FIG. 24(*h*)).

After that, the dielectric thin film 103 is etched. Subsequently, the treatment step shown in FIG. 7 is applied to supply a processing gas containing the TMCTS molecules on a surface containing damages due to the etching of the dielectric thin film to apply recovery treatment to recover a groove sidewall (FIG. 25(*i*)).

Subsequently, a CF deposit film on a sidewall of the wiring groove due to the etching process is removed, an organic solvent is used to wash to remove damages to cleanse the surface, the treatment step shown in FIG. 7 is further applied to supply a processing gas containing the TMCTS molecules on a surface containing damages due to the washing with an organic solvent to apply a recovery treatment (FIG. 25(*j*)).

Figure 25:
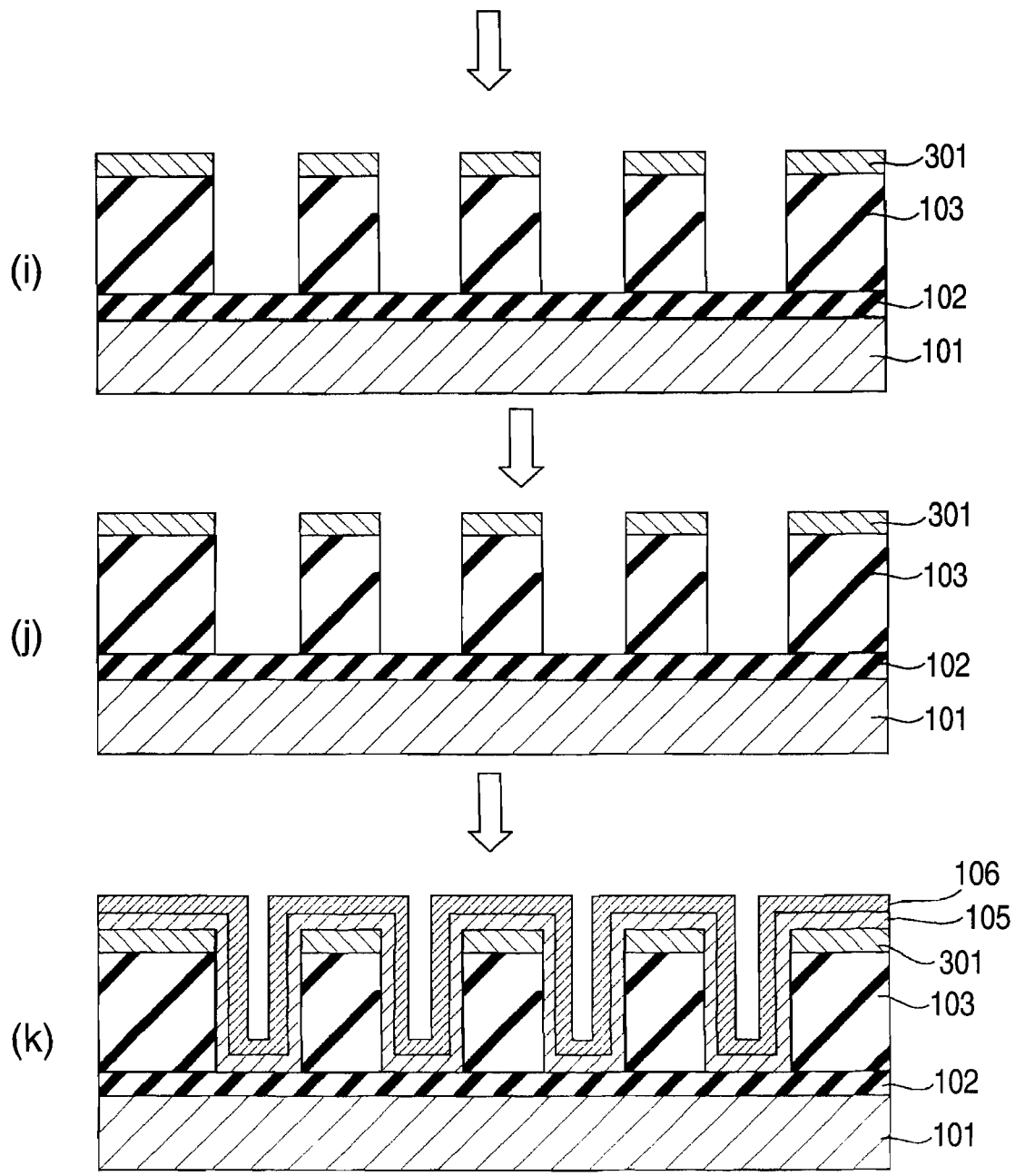
FIG. 25 is a diagram showing a production process of a semiconductor device of an embodiment 3 of the invention.

In the next place, on a cleansed surface, by means of the PVD method or CVD method, as a diffusion inhibition barrier film 105, tantalum nitride (TaN) is formed, followed by forming a copper thin film as a seed film 106 for copper plating (FIG. 25(*k*)).

Figure 26:
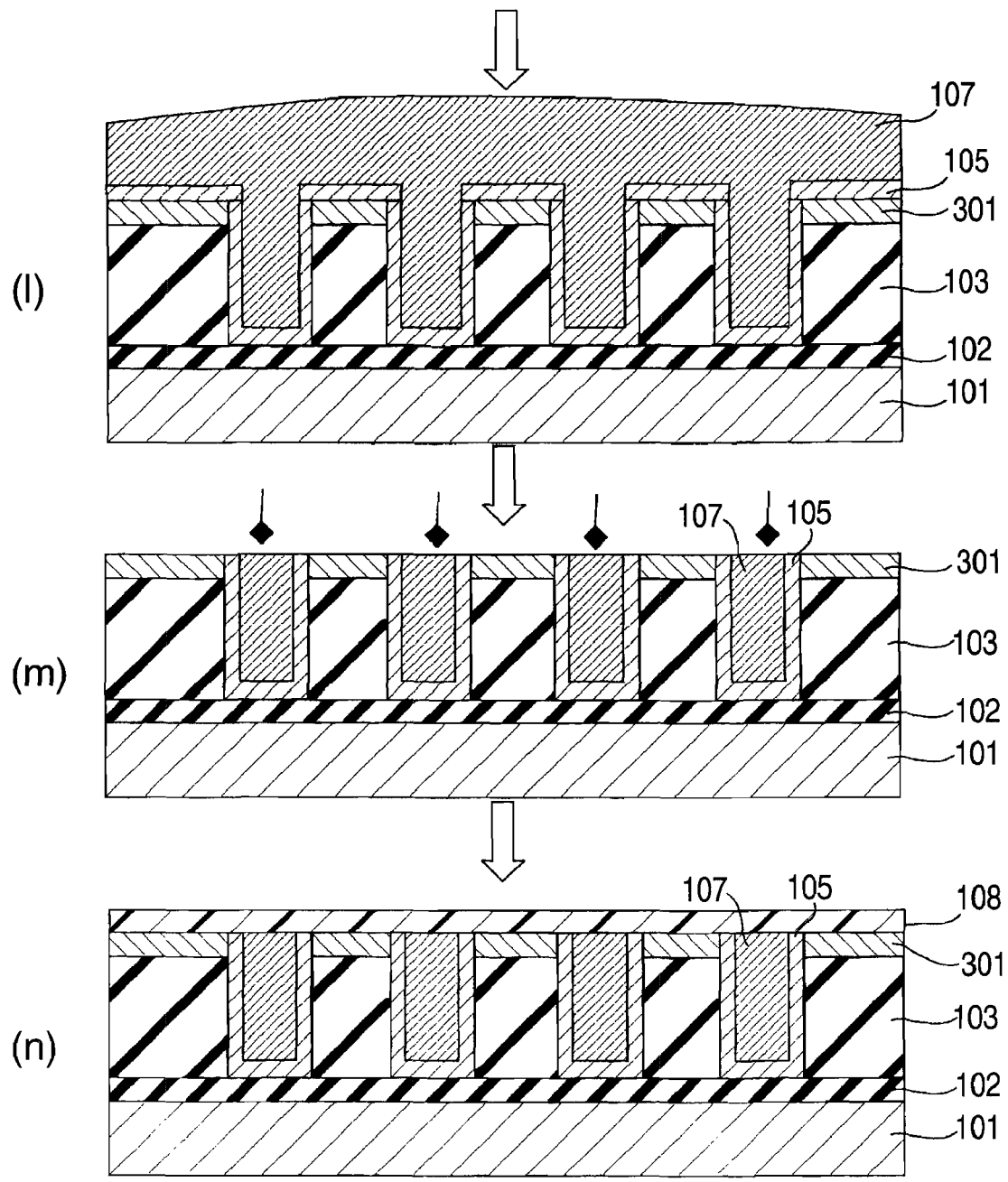
FIG. 26 is a diagram showing a production process of a semiconductor device of an embodiment 3 of the invention.
Figure 27:
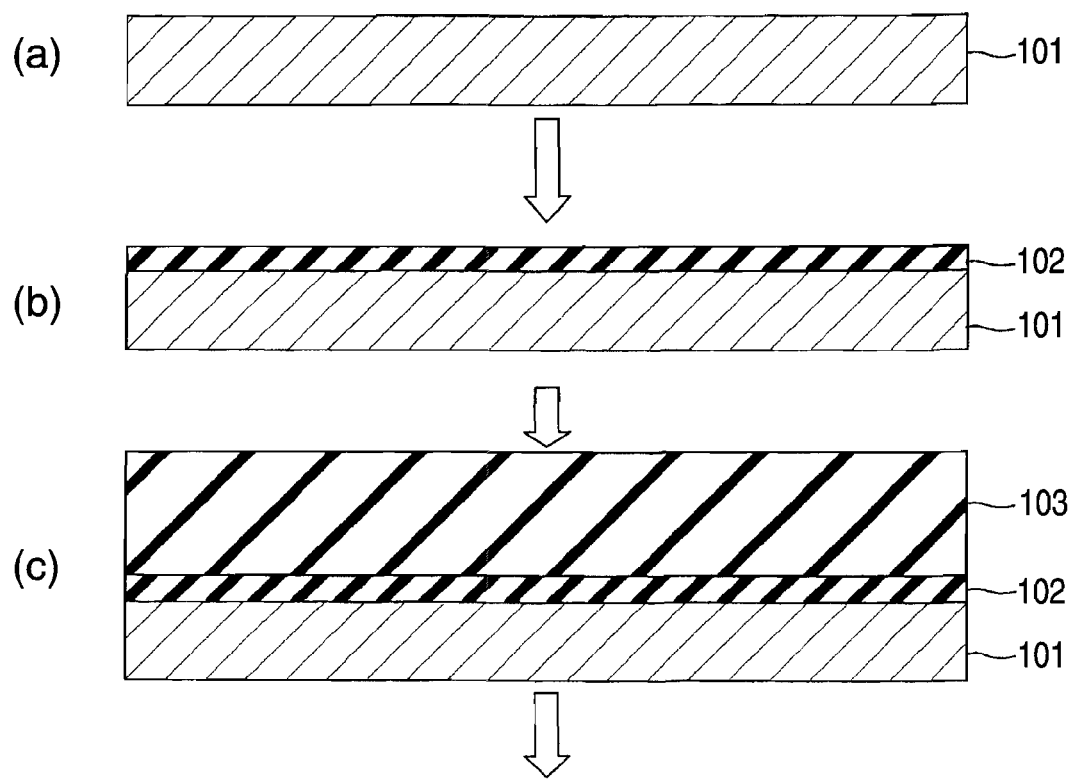
FIG. 27 is a diagram showing a production process of a semiconductor device of an existing example.
Figure 28:
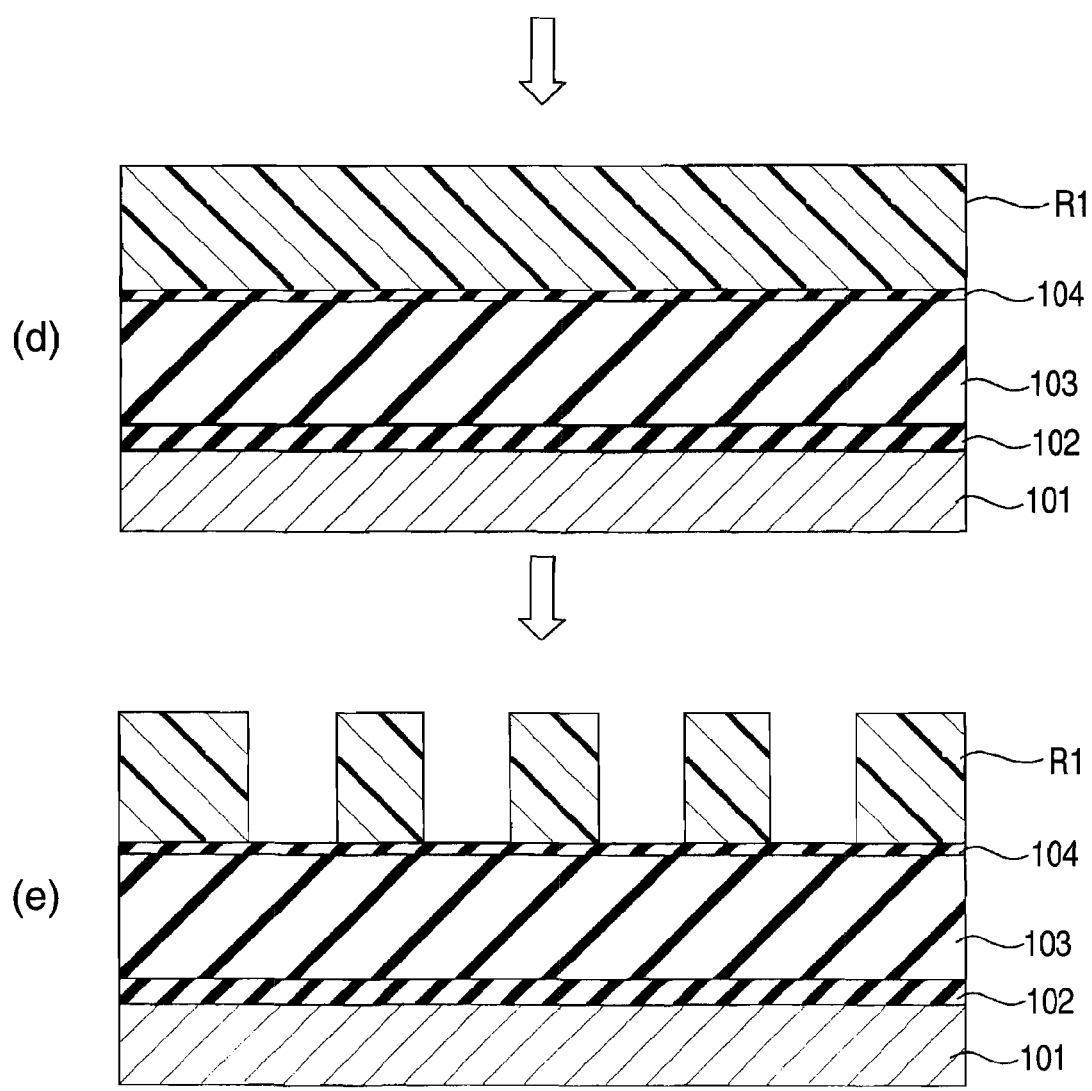
FIG. 28 is a diagram showing a production process of a semiconductor device of an existing example.
Figure 29:
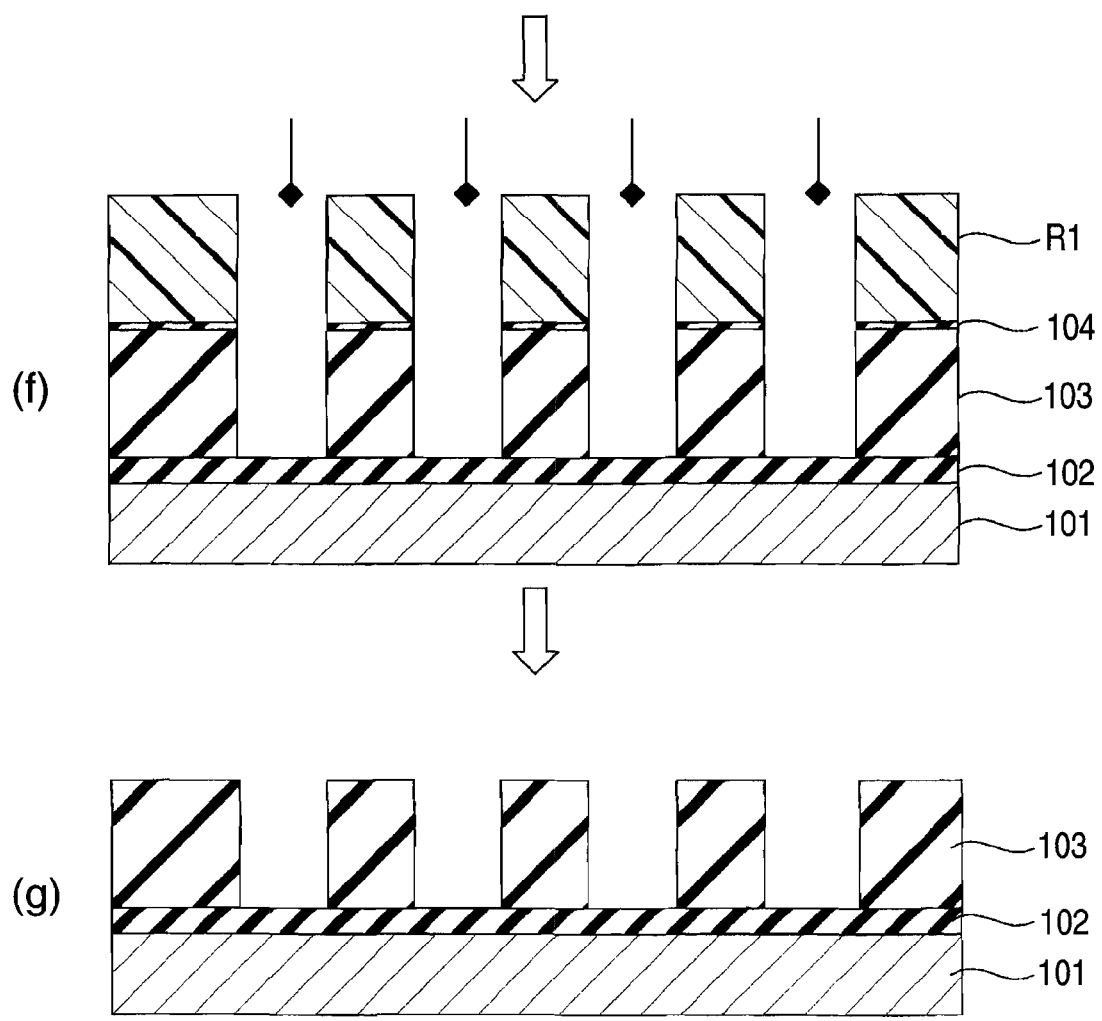
FIG. 29 is a diagram showing a production process of a semiconductor device of an existing example.
Figure 30:
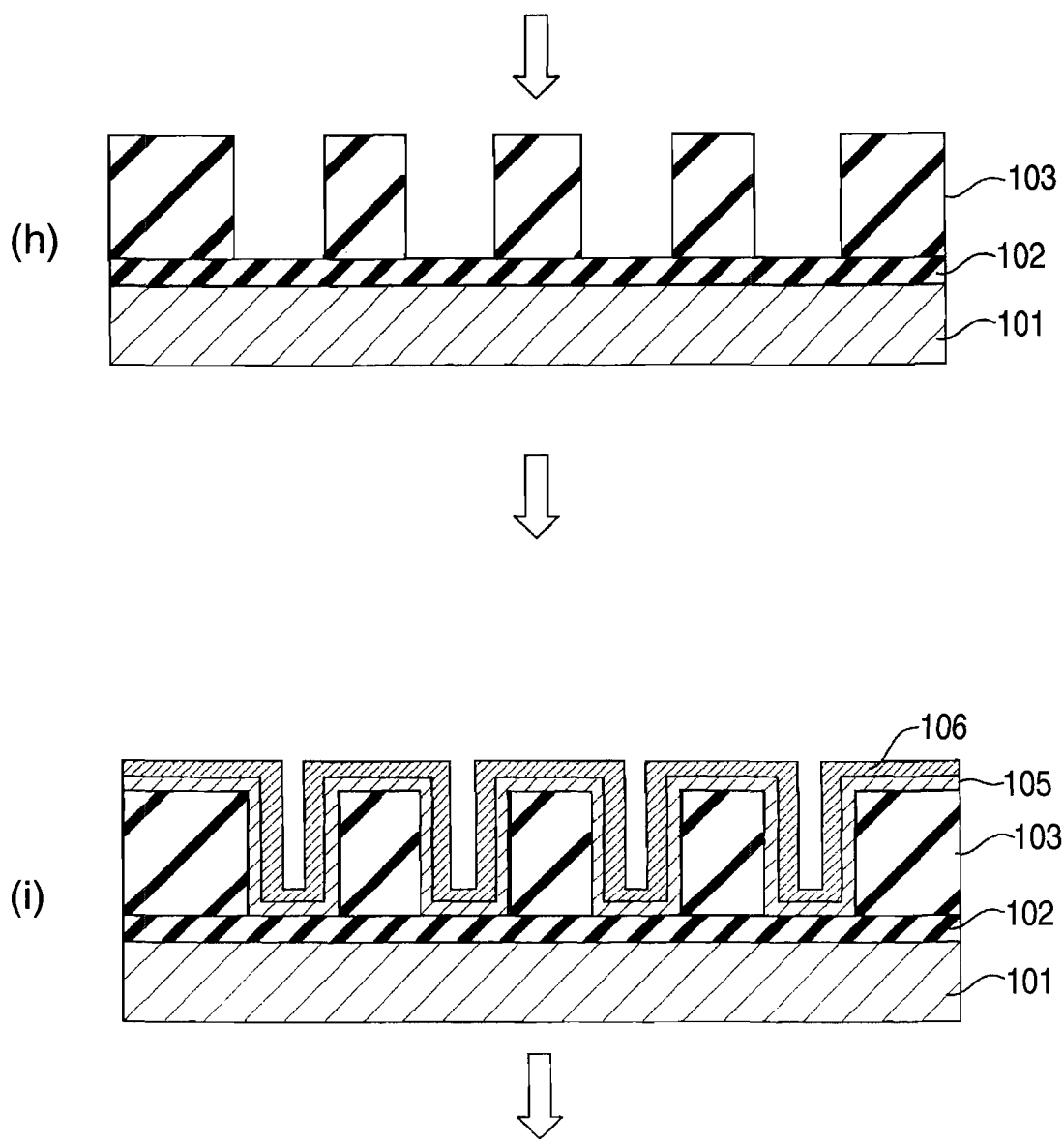
FIG. 30 is a diagram showing a production process of a semiconductor device of an existing example and FIG. 31 is a diagram showing a production process of a semiconductor device of an existing example.
Figure 31:
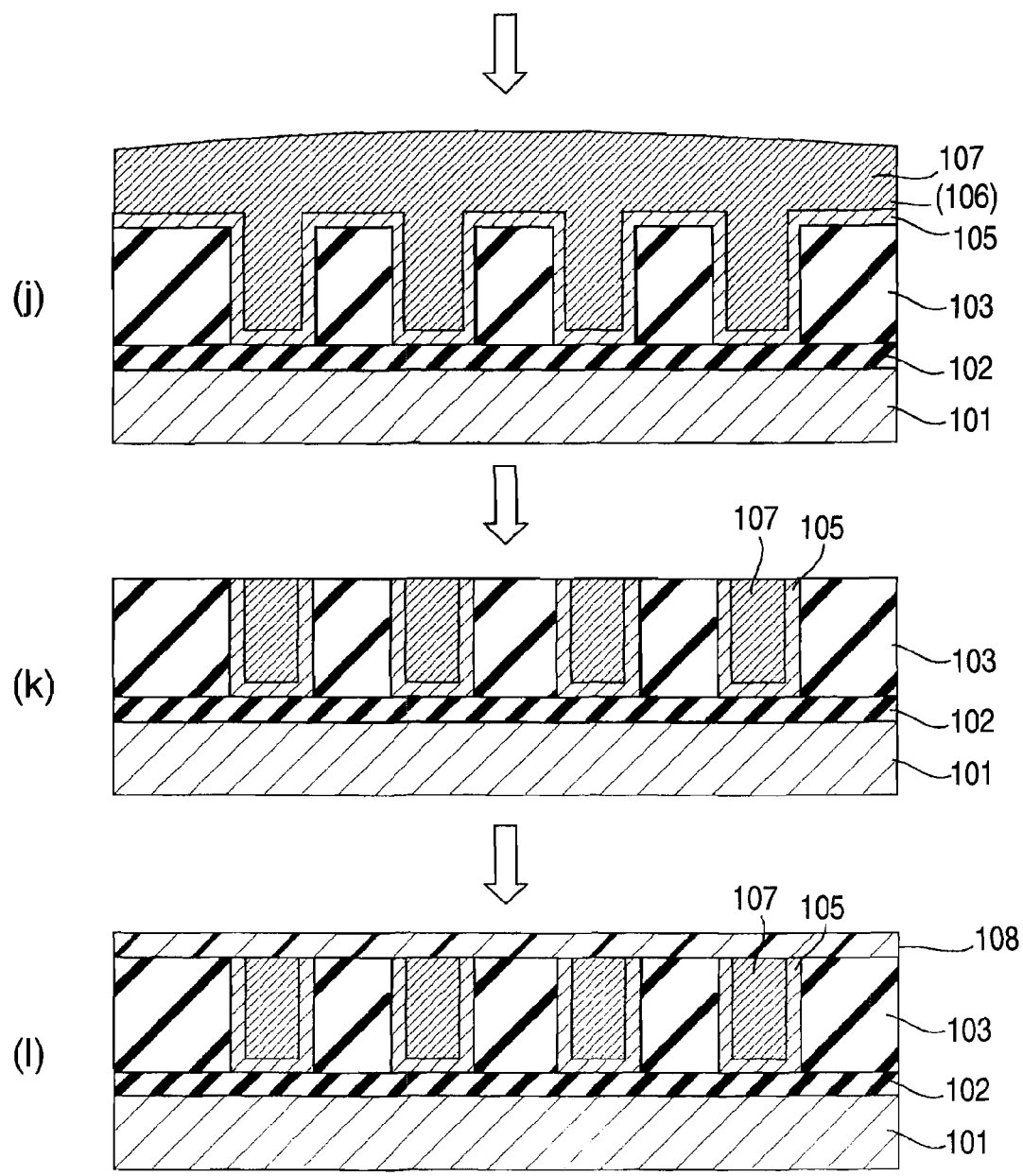

Steps after that are similar to the embodiments 1 and 2 except that (as shown in FIGS. 26(*l*) through 26(*n*)) on a top layer of the dielectric thin film 103, a silicon carbide film 301 that is used as a hard mask remains in a stacked state.

After the respective treatment steps are thus carried out, a wiring layer is formed in a wiring groove, followed by finally forming a SiN film as a cap film, further followed by evaluating the characteristics.

Thus, the dielectric constant substantially as designed can be obtained. Accordingly, a wiring structure sufficiently small in the parasite capacitance, free from the leakage current, high in the reliability and having a flat surface can be obtained.

In the embodiment, a hard mask with a single-layer structure is used; accordingly, the process damage is a little larger than that of the hard mask with a two-layer structure hard mask. However, the damages can be recovered by the recovery treatment.

The composition of the precursor solution is not restricted to that of the embodiments. Relative to a solvent of 100, a surface active agent, a silica derivative and an acid oxide, respectively, are desirably contained in the range of 0.01 to 0.1, 0.01 to 0.5 and 0 to 5. When a precursor solution having such a composition is used, a low dielectric constant insulating film having cylindrical pores can be formed.

Furthermore, in the embodiment, as a surface active agent, a cationic cetyltrimethylammonium bromide (CTAB: $C_{16}H_{33}N^+(CH_3)_3Br^-$) was used. However, it goes without saying that, without restricting thereto, other surface active agents may be used.

However, when, as a catalyst, an alkali ion such as Na ion is used, a semiconductor material is deteriorated. Accordingly, it is desirable to use a cationic surface active agent and an acid catalyst as a catalyst. As the acid catalysts, other than HCl, nitric acid ($HNO_3$), sulfuric acid ($H_2SO_4$), phosphoric acid ($H_3PO_4$), $H_4SO_4$ or the like may be used. Alternatively, a nonionic surface active agent may be used.

As the silica derivatives, without restricting to TEOS, silicon alkoxides such as tetramethoxysilane (TMOS) or the like can be desirably used.

Furthermore, as the solvent, a mixed solvent, water/alcohol, was used. However, water can be used alone.

Still furthermore, as a sintering atmosphere, an air atmosphere was used. However, reduced pressure atmosphere or a nitrogen atmosphere can be used. It is desirable to use a forming gas made of a gas mixture of nitrogen and hydrogen. In that case, since the moisture resistance is improved or microscopic electrical defects of the film are remedied, the leakage current can be reduced.

Furthermore, a blending ratio of a surface active agent, silica derivative, acid catalyst and solvent can be appropriately varied.

A preliminary polymerization step was carried out at a temperature in the range of 30 to 150° C. for a holding time in the range of 1 to 120 hr. However, it is desirable for the temperature to be set in the range of 60 to 120° C. and more desirably at 90° C.

Furthermore, the sintering step was set at 400° C. and 1 hr. However, it may be set in the range of substantially 300 to 500° C. and for 1 to 5 hr. It is desirably set in the range of 350 to 450° C.

In the embodiment, a spinner was used to coat. However, a brush coating method that uses a brush to coat may be applied.

The recovery treatment can be applied as well to, other than the porous silica film, films such as a zeolite film, HSQ film, MSQ film or one that is rendered hydrophobic as needs arise with a silica derivative such as TMCTS, HMDS, TMCS or the like.

The recovery treatment can be applied to etching processes such as an acid type, organic acid type, chlorine type, wet type, dry type or the like.

In addition to the above, in the embodiment, an interlayer insulating film that is used in a single damascene wiring structure was described. It goes without saying that the invention can be applied as well to a multilayer wiring structure that uses an aluminum wiring.

Furthermore, the dielectric thin film used in the invention is a dielectric thin film that is mainly made of Si—O bonds and may partially contain an organic element. Except that being made of Si—O bonds means being made of a structure where at least two O atoms are bonded to one Si atom and through the O atoms other Si atoms are bonded, there is no particular restriction. For instance, a hydrogen atom, halogen atom, alkyl group, phenyl group or a functional group containing these may be partially bonded to a silicon atom.

A ratio of Si to O in the dielectric thin film can be confirmed by means of elemental analysis with XPS and is preferably in the range of $0.5 \leq Si/O$ (atomic ratio) $\leq 1.0$ and a weight ratio of Si therein is preferably 40% by weight or more. Further-more, a Si—O bond can be confirmed by use of the IR. As general ones, thin films made of silica, hydrogenated silsesquioxane, methyl silsequioxane, hydrogenated methyl silsesquioxane, dimethylsiloxane and the like can be cited.

Furthermore, a surface of the dielectric thin film of the invention may be treated in advance with a well known surface active agent including a methyl group, hydrogen group or the like. For instance, a dielectric thin film treated with hexamethyldisilazane (HMDS), trimethylsilylchloride (TMSC), monosilane or the like can be used as well.

The dielectric thin film that is used in the invention preferably has meso-pores. Furthermore, an average pore diameter is preferably in the range of 0.5 to 10 nm. When the pore diameter is in this range, owing to a treatment described below, sufficient mechanical strength and low dielectric constant can be achieved in combination.

In general, an average pore diameter of a thin film can be measured by use of a 3-sample system of a full automatic gas adsorption apparatus (trade name: Autosorb-3B, manufactured by Quantachrome Instruments). In the measurement at this time, a nitrogen absorption method is carried out under a liquid nitrogen temperature (77K), a specific surface area can be obtained by means of the BET method, and a pore distribution can be obtained by the BJH method.

The dielectric thin films used in the invention are not particularly restricted as far as these are above-mentioned ones. These can be classified according to manufacturing methods thereof. That is, (1) a thin film obtained by film-forming alkoxysilane by a sol-gel method followed by rendering porous, (2) a thin film obtained by self-organizing silica sol and an organic compound, followed by removing the organic compound after film-forming to make porous, and (3) a thin film obtained by growing zeolite crystal on a surface of a substrate to render porous can be cited.

Dielectric thin films used in the manufacturing method will be described below.

(1) Thin Film Obtained by Film-Forming Alkoxysilane by a Sol-Gel Method Followed by Rendering Porous In the method, in order to obtain a porous thin film, a manufacturing method thereof is not particularly restricted. However, specifically, the porous thin film can be manufactured as shown in examples below.

In the beginning, a coating solution for film-forming is prepared. The coating solution can be obtained by adding alkoxysilane and a catalyst that are components respectively described below, and water, and as needs arise, a solvent, followed by agitating at a temperature in the range of 0 to 70° C., preferably in the range of 30 to 50° C. for several minutes to 5 hours, preferably for 1 to 3 hr. In the beginning, the respective components will be described.

(Alkoxysilane)

The alkoxysilane that is used in the production of the dielectric thin film is not particularly restricted. Specific examples thereof include tetraalkoxysilanes such as tetramethoxysilane, tetraethoxysilane, tetraisopropoxysilane, tetrabutoxysilane and the like; trialkoxyfluorosilanes such as trimethoxyfluorosilane, triethoxyfluorosilane, triisopropoxyfluorosilane, tributhoxyfluorosilane and the like; fluorine-containing alkoxysilanes such as $CF_3(CF_2)_3CH_2CH_2Si(OCH_3)_3$, $CF_3(CF_2)_5CH_2CH_2Si(OCH_3)_3$, $CF_3(CF_2)_7CH_2CH_2Si(OCH_3)_3$, $CF_3(CF_2)_9CH_2CH_2Si(OCH_3)_3$, $(CF_3)_2CF(CF_2)_4CH_2CH_2Si(OCH_3)_3$, $(CF_3)_2CF(CF_2)_6CH_2CH_2Si(OCH_3)_3$, $(CF_3)_2CF(CF_2)_8CH_2CH_2Si(OCH_3)_3$, $CF_3(C_6H_4)CH_2CH_2Si(OCH_3)_3$, $CF_3(CF_2)_3(C_6H_4)CH_2CH_2Si(OCH_3)_3$, $CF_3(CF_2)_5(C_6H_4)CH_2CH_2Si(OCH_3)_3$, $CF_3(CF_2)_7(C_6H_4)CH_2CH_2Si(OCH_3)_3$, $CF_3(CF_2)_3CH_2CH_2SiCH_3(OCH_3)_2$, $CF_3(CF_2)_5CH_2CH_2SiCH_3(OCH_3)_2$, $CF_3(CF_2)$ $_7$CH$_2$CH$_2$SiCH$_3$ (OCH$_3$)$_2$, CF$_3$(CF$_2$)$_9$CH$_2$CH$_2$SiCH$_3$ (OCH$_3$)$_2$, (CF$_3$)$_2$CF(CF$_2$)$_4$CH$_2$CH$_2$SiCH$_3$ (OCH$_3$)$_2$, (CF$_3$)$_2$CF (CF$_2$)$_6$CH$_2$CH$_2$SiCH$_3$ (OCH$_3$)$_2$, (CF$_3$)$_2$CF (CF$_2$)$_8$CH$_2$CH$_2$SiCH$_3$ (OCH$_3$)$_2$, CF$_3$(C$_6$H$_4$)CH$_2$CH$_2$SiCH$_3$ (OCH$_3$)$_2$, CF$_3$(CF$_2$)$_3$ (C$_6$H$_4$)CH$_2$CH$_2$SiCH$_3$ (OCH$_3$)$_2$, CF$_3$ (CF$_2$)$_5$ (C$_6$H$_4$)CH$_2$CH$_2$SiCH$_3$(OCH$_3$)$_2$, CF$_3$(CF$_2$)$_7$ (C$_6$H$_4$) CH$_2$CH$_2$SiCH$_3$(OCH$_3$)$_2$, CF$_3$(CF$_2$)$_3$CH$_2$CH$_2$Si(OCH$_2$CH$_3$)$_3$, CF$_3$(CF$_2$)$_5$CH$_2$CH$_2$Si(OCH$_2$CH$_3$)$_3$, CF$_3$(CF$_2$)$_7$CH$_2$CH$_2$Si (OCH$_2$CH$_3$)$_3$, CF$_3$(CF$_2$)$_9$CH$_2$CH$_2$Si(OCH$_2$CH$_3$)$_3$ and the like; trialkoxyalkylsilanes such as trimethoxymethylsilane, triethoxymethylsilane, trimethoxyethylsilane, triethoxyethylsilane, trimethoxypropylsilane, triethoxypropylsilane and the like; trialkoxyarylsilanes such as trimethoxyphenylsilane, triethoxyphenylsilane, trimethoxychlorophenylsilane, triethoxychlorophenylsilane and the like; trialkoxyphenethylsilanes such as trimethoxyphenethylsilane, triethoxyphenethylsilane and the like; and dialkoxyalkylsilanes such as dimethoxydimethylsilane, diethoxydimethylsilane and the like. Among these, tetraethyoxysilane can be preferably used.

The alkoxysilanes can be used singularly or in a combination of at least two kinds thereof.

(Catalyst)

As a catalyst used for the preparation of a coating solution, at least one kind selected from an acid catalyst or an alkali catalyst can be used.

Examples of the acid catalysts include an inorganic acid and an organic acid. Examples of the inorganic acids include hydrochloric acid, nitric acid, sulfuric acid, fluoric acid, phosphoric acid, boric acid, hydrobromic acid and the like. Meanwhile, examples of the organic acids include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, tartaric acid, succinic acid, fumaric acid, itaconic acid, mesaconic acid, citraconic acid, malic acid and the like.

Examples of the alkali catalysts include ammonium salts and nitrogen-containing compounds. Examples of ammonium salts include tetramethylammonium hydroxide, tetraethylammonium hydroxide, tetrapropylammonium hydroxide, tetrabutylammonium hydroxide and the like. Examples of nitrogen-containing compounds include pyridine, pyrrol, piperidine, 1-methylpiperidine, 2-methylpiperidine, 3-methylpiperidine, 4-methylpiperidine, piperazine, 1-methylpiperazine, 2-methylpiperazine, 1,4-dimethylpiperazine, pyrrolidine, 1-methylpyrrolidine, picoline, monoethanolamine, diethanolamine, dimethyl monoethanolamine, monomethyl diethanolamine, triethanolamine, diazabicyclooctane, diazabicyclononane, diazabicycloundecene, 2-pyrazoline, 3-pyrroline, quinuclidine, ammonia, methylamine, ethylamine, propylamine, butylamine, N,N-dimethylamine, N,N-diethylamine, N,N-dipropylamine, N,N-dibutylamine, trimethylamine, triethylamine, tripropylamine, tributylamine and the like.

(Solvent)

Examples of solvents that can be used for the preparation of a coating solution include mono-alcohol solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethyl carbinol, diacetone alcohol, cresol and the like; polyhydric alcohol solvents such as ethylene glycol, 1,2-propylene glycol, 1,3-butylene glycol, pentanediol-2,4, 2-methylpentanediol-2,4, hexanediol-2,5, heptanediol-2,4,2-ethylhexanediol-1,3, diethylene glycol, dipropylene glycol, triethylene glycol, tripropylene glycol, glycerine and the like; ketone solvents such as acetone, methyl ethyl ketone, methyl-n-propyl ketone, methyl-n-butyl ketone, diethyl ketone, methyl-i-butyl ketone, methyl-n-pentyl ketone, ethyl-n-butyl ketone, methyl-n-hexyl ketone, di-i-butyl ketone, trimethylnonanone, cyclohexanone, 2-hexanone, methylcyclohexanone, 2,4-pentanedione, acetonylacetone, diacetone alcohol, acetophenone, fenthion and the like; ether solvents such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monomethyl ether, tripropylene glycol monomethyl ether, tetrahydrofuran, 2-methyltetrahydrofuran and the like; ester solvents such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate and the like; and nitrogen-containing solvents such as N-methylformamide, N,N-dimethylformamide, N,N-diethylformamide, acetamide, N-methylacetamide, N,N-dimethylacetamide, N-methylpropionamide, N-methylpyrrolidone and the like.

The solvents can be used singularly or in a combination of at least two kinds thereof.

The method of adding the respective components is arbitrary and an order of addition is not particularly restricted. However, it is preferred to add water in two divisions to alkoxysilane to control the hydrolysis and dehydrocondensation of alkoxysilane. When water is added for the first time, in order not to complete the hydrolysis and dehydrocondensation, a ratio of water to alkoxyl groups of alkoxysilane (by mole ratio) may be in the range of 0.1 to 0.3 and preferably in the range of 0.2 to 0.25. When water is added for the second time, water may be arbitrarily added. However, the ratio of water to alkoxy groups of alkoxysilane (by mole ratio) is preferably set in the range of 1 to 10. The time required between the first time addition of water and the second time addition of water, without restricting particularly, can be arbitrarily set. An amount of a catalyst added may be in any range as far as it can promote the reaction and the molar ratio of alkoxysilane to a catalyst is preferably in the range of 1:0.1 to 0.001 by mole ratio. When a solvent is employed for dilution, a ratio of dilution is in the range of 1 to 100 times and preferably in the range of 3 to 20 times.

The alkoxysilane, catalyst and water, and a solvent as required are added, followed by agitating for substantially several minutes to 5 hr to obtain a coating solution. The coating solution is coated on a substrate to obtain a precursor of a dielectric thin film. When the kind of a solvent or alkoxysilane to be used is changed, the porosifying conditions of a thin film can be controlled. When, by drying or calcining, the solvent is evaporated or an alcohol component generated by the hydrolysis is removed, pores are formed and thereby a dielectric thin film can be obtained.

As examples of methods for coating on a substrate, general methods such as a spin coating method, a cast coating method, a dip coating method and the like. In the case of the spin coating method, a substrate is placed on a spinner, a sample is dropped on the substrate, the substrate is rotated at from 500 to 10,000 rpm, and thereby a dielectric thin film having a uniform film thickness and excellent in the smoothness of the surface thereof can be obtained.

When the solvent or an alcohol component generated by the hydrolysis of alkoxysilane is dried and calcined to remove, the drying conditions are not particularly restricted, and any condition is available as far as the solvent or alcohol component can be evaporated. The calcining conditions are neither particularly restricted, and any condition is available as far as the condensation of a silanol group in a thin film according to the calcination can be further promoted. Accordingly, the calcination may be carried out in an atmosphere of any one of air, inert gas and vacuum. However, when H or a methyl group is present in the thin film, a temperature where these are not decomposed is required for the calcination. Specifically, the calcination is desirably carried out at a temperature in the range of 250 to 450° C. in a nitrogen atmosphere.

Furthermore, the solvent and the alcohol component generated by the hydrolysis of alkoxysilane can be removed as well by use of an organic solvent small in the surface tension or a supercritical fluid. In particular, the removal by the supercritical fluid that has no surface tension when pressure and temperature are regulated is preferable because pores of the thin film are not broken and a highly porous film can be obtained.

In such a manufacturing method, the dielectric thin film can be obtained in a state where it is in a self-supporting state or fastened to a substrate. Pores of the obtained thin film can be confirmed to have the average pore diameter in the range of 0.5 to 10 nm by cross sectional TEM observation of the thin film or measurement of the pore size distribution. Furthermore, a thickness of the thin film is, though different depending on the manufacturing conditions, in the range of substantially in the range of 0.05 to 2 μm.

(2) Thin Film That is Porosified by Self-Agglomeration of Silica Sol and Organic Compound When Forming Film with Alkoxysilane by Sol-Gel Method and Removing the Organic Compound After Forming a Film A porous thin film that is obtained due to self-agglomeration of silica sol and an organic compound when a film is formed from alkoxysilane by a sol gel method and the organic compound is removed after forming a film can be obtained from a coating solution in which, in the production of a thin film (1), in a process for preparing a coating solution with alkoxysilane, as a pore forming agent (a mold), for example, an organic compound such as a surface active agent is further added.

As the aforementioned surface active agent, usually a compound having a long-chain alkyl group and a hydrophilic group can be used. The long-chain alkyl group is preferably one having 8 to 24 carbon atoms and further preferably one having 12 to 18 carbon atoms. Furthermore, examples of the hydrophilic groups include a group of quaternary ammonium salt, an amino group, a nitroso group, a hydroxyl group, a carboxyl group and the like. Among these, a group of quaternary ammonium salt or a hydroxyl group is preferable.

Specifically, as such a surface active agent, an alkylammonium salt represented by a general formula below:

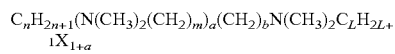

(In the formula, a is an integer between 0 and 2; b is an integer between 0 and 4; n is an integer between 8 and 24; m is an integer between 0 and 12; L is an integer between 1 and 24; and X is a halide ion, $HSO_4^-$ or a monovalent organic anion.) can be preferably used.

The surface active agent represented by the aforementioned general formula forms micelles in a coating solution to be regularly arranged. In the invention, the micelle acts as a mold to form a complex from silica obtained by the hydrolysis and dehydrocondensation of alkoxysilane and a surface active agent. Then, by removing the surface active agent of the mold, a porous dielectric thin film having uniform pores regularly arranged can be prepared.

Furthermore, as the surface active agent, a compound having a polyalkylene oxide structure can be used as well. Examples of the polyalkylene oxide structures include a polyethylene oxide structure, a polypropylene oxide structure, a polytetramethylene oxide structure, a polybutylene oxide structure and the like.

Specific examples of compounds having the polyalkylene oxide structure specifically include ether type compounds such as polyoxyethylene polyoxypropylene block copolymer, polyoxyethylene polyoxybutylene block copolymer, polyoxyethylene polyoxypropylene alkyl ether, polyethylene alkyl ether, polyoxyethylene alkyl phenyl ether and the like; and ether ester type compounds such as polyoxyethylene glycerin fatty acid ester, polyoxyethylene sorbitan fatty acid ester, polyethylene sorbitol fatty acid ester, sorbitan fatty acid ester, propylene glycol fatty acid ester, sucrose fatty acid ester and the like.

In the invention, the surface active agents can be used singularly or in a combination of at least two kinds selected therefrom.

An addition ratio of alkoxysilane, a catalyst and water is the same as the aforementioned method (1). However, an addition amount of the surface active agent is preferably in the range of 0.002 to 0.6 times and more preferably in the range of 0.005 to 0.15 times based on the molar ratio of the alkoxysilane. The surface active agent may be added in any state of a solid, a liquid and a solution obtained by dissolving the surface active agent in a solvent, without restricting to particular one.

By changing the combination between the surface active agent and alkoxysilane, the molar ratio therebetween or the like, according to the foregoing method (2), a dielectric thin film having a periodic pore structure such as a 2D-hexagonal structure, a 3D-hexagonal structure, a cubic structure or the like can be manufactured.

In order to obtain such a dielectric thin film, the coating solution obtained according to the method as mentioned above, similarly to the foregoing method (1), may be coated on a substrate followed by drying, further followed by calcining or extracting with an organic solvent to remove the surface active agent. Pores of the thus-obtained dielectric thin film can be confirmed to have the average pore diameter in the range of 1 to 10 nm by cross sectional TEM observation of a thin film or the measurement of pore size distribution. Furthermore, when the porous thin film has a periodic pore structure such as a 2D-hexagonal structure, a 3D-hexagonal structure, a cubic structure or the like, a diffraction peak having an interplanar spacing in the range of 1.3 to 13 nm can be confirmed by the X-ray diffractometry (CuKα).

When the thus-obtained dielectric thin film has pores of a cubic structure and particularly has a pore narrow part having a spacing from 1 to 40 Å between the pore walls in a pore and preferably from 2 to 25 Å, the pore narrow part can be easily closed by the modification treatment to be described later so that a dielectric thin film in which the pore narrow part is at least partially closed can be obtained. The measurement of a magnitude of such a pore narrow part can be confirmed by the electron beam structure analysis. The thus-obtained dielectric thin film is excellent in the hydrophobicity. Furthermore, when it is used for a semiconductor material, a dielectric thin film that can inhibit a barrier metal from diffusing can be formed.

The dielectric thin film having such a pore narrow part can be formed as well in a dielectric thin film having a 2D-hexagonal structure or a 3D-hexagonal structure in which a narrow part is formed in a pore, in addition to a dielectric thin film having a cubic structure.

For instance, a coating solution is prepared by partial hydrolysis and dehydrocondensation of alkoxysilane in the presence of a surface active agent and silicon oil. In this case, it is preferable that a mixed solution is prepared by mixing a surface active agent with silicon oil in advance and the resulting mixture is added to alkoxysilane that is partially hydrolyzed and dehydrocondensed. Here, the term "being partially hydrolyzed and dehydrocondensed" means a state where the mixed solution is fluidized without being gelated. In general, when the viscosity exceeds 105 poise, a solution is viewed as gelated. Accordingly, the solution has not the viscosity more than the foregoing viscosity.

It is considered that, when a coating solution is prepared in this manner, a surface active agent is arranged with silicon oil at a center to form a micelle. Then, it is considered that, when the coating solution is coated on a substrate, followed by drying, further followed by calcining to remove the surface active agent, the silicon oil confined in the center of micelle remains in a state attached to the surface inside of a pore of the dielectric thin film to form the aforementioned narrow part.

The foregoing silicon oil include, without particularly restricting, organic silicon compounds having polydimethylsiloxane as a main component. Examples of such compounds include trimethylsiloxy-terminated polydimethylsiloxane, a copolymer of polyphenylsiloxane and polydimethylsiloxane, a copolymer of polyphenylmethylsiloxane and polydimethylsiloxane, a copolymer of poly-3,3,3-trifluoropropylmethylsiloxane and polydimethylsiloxane, a copolymer of polyethylene oxide and polydimethylsiloxane, a copolymer of polypropylene oxide and polydimethylsiloxane, a copolymer of polyethylene oxide, polypropylene oxide and polydimethylsiloxane, hydride-terminated polydimethylsiloxane, a copolymer of polymethylhydridesiloxane and polydimethylsiloxane, silanol-terminated polydimethylsiloxane and the like.

The silicon oil used in the present invention can be used singularly or in a combination of at least two kinds selected from the foregoing compounds.

An amount of the silicon oil added is preferably in the range of 1 to 100 parts by weight and more preferably in the range of 5 to 50 parts by weight, based on 100 parts by weight of the alkoxysilane. When the amount of the silicon oil added is set within the aforementioned range, a dielectric thin film in which a narrow part is formed in a pore can be easily prepared.

In the dielectric thin film in which at least a part of the pore narrow part is closed, the fact that the pore narrow part is closed and improvement of the hydrophobicity can be confirmed by the measurement of dielectric constant and cross sectional TEM observation of a thin film, which will be described later.

(3) Thin Film that is Porosified by Crystal Growth of Zeolite on Surface of Substrate A thin film that is porosified can be obtained as well by crystal growth of zeolite on a surface of a substrate. The manufacturing method thereof is not particularly restricted. However, specifically, for instance, the following methods can be cited.

(A) A coating solution containing crystallites of zeolite obtained by hydrothermal synthesis of a silica source such as alkoxysilane, colloidal silica or the like and with organic amine as a mold is coated on a substrate, followed by drying and calcining to manufacture.

(B) A surface active agent is added to a coating solution containing crystallites of zeolite obtained by hydrothermal synthesis of a silica source of alkoxysilane, colloidal silica or the like and with organic amine as a mold, followed by coating on a substrate, further followed by drying and calcining to prepare.

(C) In hydrothermal synthesis with alkoxysilane, colloidal silica or the like as a silica source and with organic amine as a mold, a substrate is inserted to grow crystallites of zeolite on a surface of the substrate, followed by drying and calcining to prepare.

(D) A substrate coated with silica gel is subjected to zeolite crystallization in aqueous vapor containing an organic amine, followed by drying and calcining to prepare (dry gel conversion).

As the organic amines which can be used for the foregoing preparation, tetrapropylammonium hydroxide, tetraethylammonium hydroxide, tetrabutylammonium hydroxide, tetrapentylammonium hydroxide, tripropylamine, triethylamine, triethanolamine, piperidine, cyclohexylamine, neopentylamine, isopropylamine, t-butylamine, 2-methylpyridine, N,N'-dimethylbenzylamine, N,N-diethylethanolamine, di(n-butyl)amine, di(n-pentyl)amine, dicyclohexylamine, N,N-dimethylethanolamine, cholin, N,N-dimethylpiperazine, 1,4-diazabicyclo(2,2,2)octane, N-methyldiethanolamine, N-methylethanolamine, N-methylpiperidine, quinuclidine, N,N'-dimethyl-1,4-diazabicyclo(2,2,2)octane dihydroxide, ethylenediamine, 2-imidazolidone and the like can be cited.

The obtained dielectric thin films can be confirmed to have a zeolite structure from the diffraction peak obtained by the X-ray diffractometry (CuKα).

INDUSTRIAL APPLICABILITY

As mentioned above, according to the invention, a low dielectric constant insulating film excellent in the controllability and high in the mechanical strength can be readily obtained. The low dielectric constant insulating film can be applied as well to high-speed devices including various kinds of semiconductor devices that use silicon and devices that use a compound semiconductor such as HEMT, high frequency devices such as microwave ICs, MFMIS type high integration ferroelectric memories, microwave transmission line or multi-layered wiring substrates that use a film carrier and the like.

The invention claimed is:

1. A semiconductor device comprising:
    a semiconductor substrate;
    a dielectric thin film having a plurality of contact pores therein and formed on a surface of the semiconductor substrate; and
    a conductive film filled in the contact pores,
    wherein the contact pores have a wall distance of 0.2 to 2.5 nm, and
    the conductive film comes into contact with the semiconductor substrate.

2. The semiconductor device according to claim 1, wherein the dielectric thin film is a porous silica thin film, and a copper thin film formed inside the contact pores constitutes a wiring layer.

3. The semiconductor device according to claim 2, wherein the porous silica thin film has a thickness of 0.05 to 2 μm.

4. The semiconductor device according to claim 2, wherein the porous silica thin film has fine pores having a cubic structure, and at least a part of the fine pores is closed.

* * * * *